(12) United States Patent
Lee et al.

(10) Patent No.: US 11,289,469 B2
(45) Date of Patent: Mar. 29, 2022

(54) INTEGRATED CIRCUIT AND SEMICONDUCTOR DEVICE

(71) Applicant: Samsung Electronics Co., Ltd., Suwon-si (KR)

(72) Inventors: Seung-Young Lee, Seoul (KR); Jong-hoon Jung, Seongnam-si (KR); Myoung-ho Kang, Suwon-si (KR); Jung-ho Do, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/038,292

(22) Filed: Sep. 30, 2020

(65) Prior Publication Data

US 2021/0028160 A1    Jan. 28, 2021

Related U.S. Application Data

(63) Continuation of application No. 16/685,471, filed on Nov. 15, 2019, now Pat. No. 10,804,257, which is a
(Continued)

(30) Foreign Application Priority Data

Oct. 17, 2016    (KR) .................... 10-2016-0134544

(51) Int. Cl.
*H01L 27/02* (2006.01)
*G11C 11/419* (2006.01)
(Continued)

(52) U.S. Cl.
CPC .......... *H01L 27/0207* (2013.01); *G11C 11/40* (2013.01); *G11C 11/419* (2013.01);
(Continued)

(58) Field of Classification Search
CPC ............ H01L 27/0207; H01L 23/5286; H01L 27/105; H01L 27/11803; H01L 21/76895;
(Continued)

(56) References Cited

U.S. PATENT DOCUMENTS 8,258,578 B2    9/2012  Carlson
8,264,044 B2 *  9/2012  Becker .............. H01L 23/49844
                                                              257/369
(Continued)

FOREIGN PATENT DOCUMENTS

KR    2016-0039530 A    4/2016
KR    2016-0040085 A    4/2016

OTHER PUBLICATIONS

Taiwanese Office Action dated Nov. 12, 2020 issued in Taiwanese Patent Application No. 106135492.

*Primary Examiner* — Jonathan Han
(74) *Attorney, Agent, or Firm* — Harness, Dickey & Pierce, P.L.C.

(57) ABSTRACT

In one embodiment, the standard cell includes first and second active regions defining an intermediate region between the first and second active regions; and first, second and third gate lines crossing the first and second active regions and crossing the intermediate region. The first gate line is divided into an upper first gate line and a lower first gate line by a first gap insulating layer in the intermediate region, the second gate line is undivided, and the third gate line is divided into an upper third gate line and a lower third gate line by a second gap insulating layer in the intermediate region.

28 Claims, 22 Drawing Sheets

Related U.S. Application Data continuation of application No. 15/674,931, filed on Aug. 11, 2017, now Pat. No. 10,515,943.

(51) Int. Cl.
| | | |
|---|---|---|
| *G11C 11/40* | (2006.01) | |
| *H01L 23/528* | (2006.01) | |
| *H01L 27/105* | (2006.01) | |
| *H01L 27/118* | (2006.01) | |
| *G11C 5/14* | (2006.01) | |
| *G11C 7/18* | (2006.01) | |

(52) U.S. Cl.
CPC ........ H01L 23/5286 (2013.01); H01L 27/105 (2013.01); H01L 27/11803 (2013.01); *G11C 5/147* (2013.01); *G11C 7/18* (2013.01)

(58) Field of Classification Search
CPC ............. H01L 23/5386; H01L 27/1104; H01L 27/11807; H01L 2027/11875; G11C 11/40; G11C 11/419; G11C 5/147; G11C 7/18
USPC ................... 257/401; 438/598, 599
See application file for complete search history.

(56) References Cited

U.S. PATENT DOCUMENTS

| | | | |
|---|---|---|---|
| 8,264,049 | B2 | 9/2012 | Becker |
| 8,741,763 | B2 | 6/2014 | Ma et al. |
| 8,969,199 | B1 * | 3/2015 | Yuan ................ H01L 21/31144 |
| | | | 438/666 |
| 8,987,128 | B2 | 3/2015 | Rashed et al. |
| 9,035,359 | B2 * | 5/2015 | Becker .................. G06F 30/392 |
| | | | 257/206 |
| 9,583,493 | B2 | 2/2017 | Kim et al. |
| 9,589,955 | B2 | 3/2017 | Baek et al. |
| 2013/0032885 | A1 | 2/2013 | Swamynathan et al. |
| 2015/0179646 | A1 * | 6/2015 | Azmat ............ H01L 21/823871 |
| | | | 257/369 |
| 2015/0325514 | A1 | 11/2015 | Mojumder et al. |
| 2016/0056161 | A1 | 2/2016 | Hong et al. |
| 2016/0064067 | A1 | 3/2016 | Mojumder et al. |
| 2016/0097811 | A1 | 4/2016 | Kim et al. |
| 2016/0104678 | A1 | 4/2016 | Jun et al. |

\* cited by examiner

US 11,289,469 B2

INTEGRATED CIRCUIT AND SEMICONDUCTOR DEVICE

CROSS-REFERENCE TO RELATED APPLICATION

This application is a continuation of U.S. application Ser. No. 16/685,471, filed on Nov. 15, 2019, which is a continuation of U.S. application Ser. No. 15/674,931, filed on Aug. 11, 2017, now granted as U.S. Pat. No. 10,515,943 on Dec. 24, 2019, which claims the benefit of Korean Patent Application No. 10-2016-0134544, filed on Oct. 17, 2016, in the Korean Intellectual Property Office, the disclosure of each of which is incorporated herein in its entirety by reference.

BACKGROUND

The inventive concepts relate to an integrated circuit, and more particularly, to an integrated circuit including a standard cell and/or a semiconductor device manufactured according to the integrated circuit.

As semiconductor processing techniques have developed, down-scaling of the integrated circuit has been performed rapidly, and recently, heights of standard cells included in the integrated circuit have been decreased. In an integrated circuit including a cross-couple structure, a layout from which a process risk pattern is removed and which does not violate design constrains is desired.

SUMMARY

At least one embodiment is directed to a standard cell.

In one embodiment, the standard cell includes first and second active regions defining an intermediate region between the first and second active regions; and first, second and third gate lines crossing the first and second active regions and crossing the intermediate region. The first gate line is divided into an upper first gate line and a lower first gate line by a first gap insulating layer in the intermediate region, the second gate line is undivided, and the third gate line is divided into an upper third gate line and a lower third gate line by a second gap insulating layer in the intermediate region.

In another embodiment, the standard cell includes first and second active regions defining an intermediate region between the first and second active regions; an upper first gate line crossing the first active region and a portion of the intermediate region; and a lower first gate line crossing the second active region. The lower first gate line is separated from and arranged linearly with the upper first gate line such that a first gap exists between the upper first gate line and the lower first gate line in the intermediate region. A first gap insulating layer is disposed in the first gap. A second gate line crosses the first and second active regions and continuously crossing the intermediate region. A lower third gate line crosses the second active region and a portion of the intermediate region, and an upper third gate line crosses the first active region. The upper third gate line is separated from and arranged linearly with the lower third gate line such that a second gap exists between the upper third gate line and the lower third gate line in the intermediate region. A second gap insulating layer is disposed in the second gap.

In a further embodiment, the standard cell includes first and second active regions defining an intermediate region between the first and second active regions; an upper first gate line crossing the first active region and only a portion of the intermediate region; a second gate line crossing the first and second active regions and continuously crossing the intermediate region; a lower third gate line crossing the second active region and only a portion of the intermediate region; and a first metal line electrically connecting the upper first gate line and the lower third gate line.

BRIEF DESCRIPTION OF THE DRAWINGS

Embodiments of the inventive concepts will be more clearly understood from the following detailed description taken in conjunction with the accompanying drawings in which.

DETAILED DESCRIPTION

In some embodiments of the present specification, it will be described that a standard cell includes a gate line, and a semiconductor device implemented according to the standard cell includes a gate electrode corresponding to the gate line. In addition, it will be described that the standard cell includes a cutting layer, and the semiconductor device implemented according to the standard cell includes a cutting region corresponding to the cutting layer.

Figure 1:
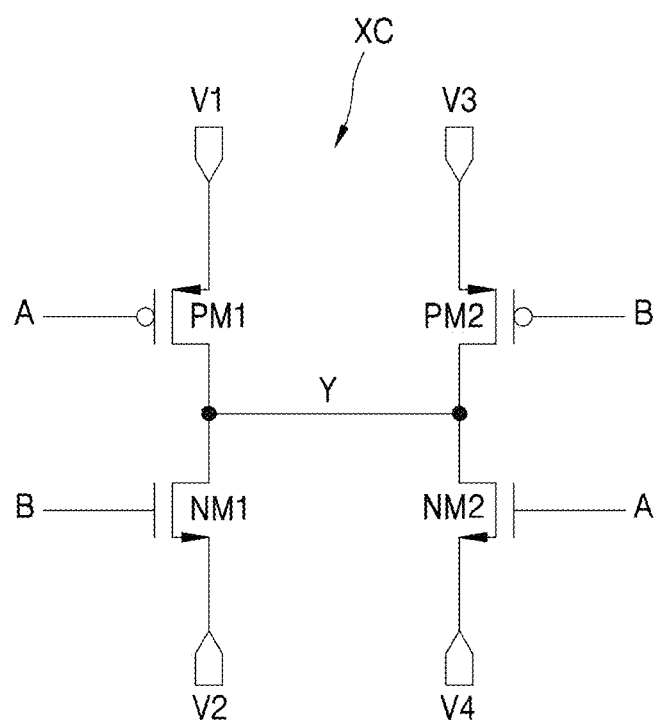
FIG. 1 is a circuit diagram of a cross-couple structure according to an embodiment.

FIG. 1 is a circuit diagram of a cross-couple structure XC according to an embodiment.

Referring to FIG. 1, the cross-couple structure XC may include a first PMOS transistor PM1 and a first NMOS transistor NM1 connected in series, and a second PMOS transistor PM2 and a second NMOS transistor NM2 connected in series. The cross-couple structure XC according to the embodiment may be included in various standard cells including, for example, sequential logic cells such as a latch and a flip-flop, or combinational logic cells such as a multiplexer and an adder.

In detail, the first PMOS transistor PM1 may include a source connected to a first voltage terminal V1, a gate receiving a first control signal A, and a drain connected to an output node Y. The first NMOS transistor NM1 may include a drain connected to the output node Y, a gate receiving a second control signal B, and a source connected to a second voltage terminal V2. The second PMOS transistor PM2 may include a source connected to a third voltage terminal V3, a gate receiving the second control signal B, and a drain connected to the output node Y. The second NMOS transistor NM2 may include a drain connected to the output node Y, a gate receiving the first control signal A, and a source connected to a fourth voltage terminal V4.

In the embodiment, the gates of the first PMOS transistor PM1 and the second NMOS transistor NM2 are electrically connected to each other to receive the first control signal A. In addition, the gates of the first NMOS transistor NM1 and the second PMOS transistor PM2 are electrically connected to each other to receive the second control signal B. As such, the first and second PMOS transistors PM1 and PM2 and the first and second NMOS transistors NM1 and NM2 may form the cross-couple structure XC.

Figure 2A:
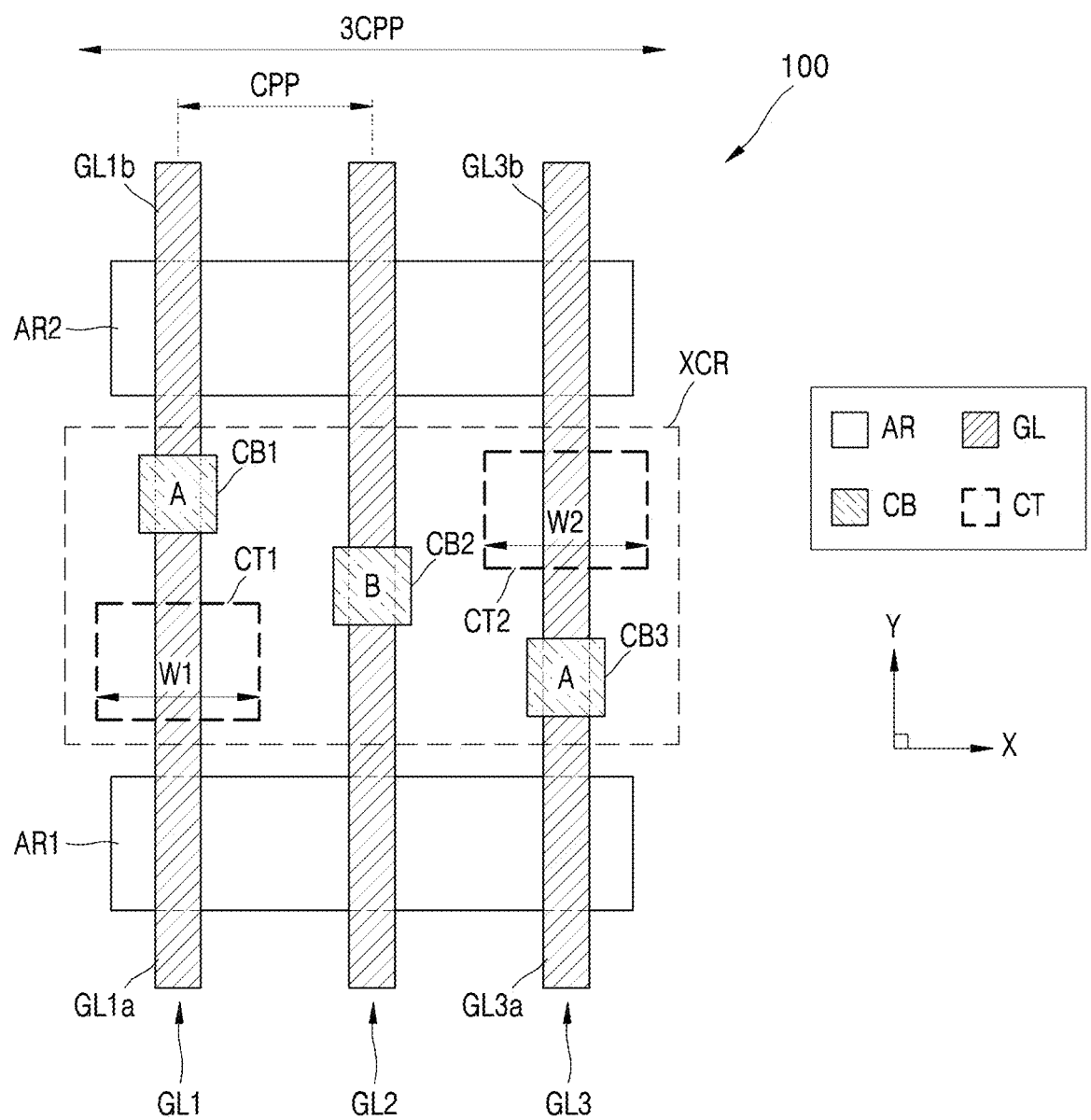
FIGS. 2A and 2B are diagrams showing a layout of a part of a standard cell, which corresponds to the cross-couple structure of FIG. 1, according to some embodiments.

FIG. 2A is a layout of a part of a standard cell 100 corresponding to the cross-couple structure XC of FIG. 1, according to an embodiment.

Referring to FIG. 2A, the standard cell 100 may include first and second active regions AR1 and AR2, first to third gate lines GL1, GL2, and GL3, first and second cutting layers CT1 and CT2, and first to third contacts CB1 to CB3. In the present specification, a region where the first and second cutting layers CT1 and CT2 and the first to third contacts CB1 to CB3 are arranged will be referred to as in intermediate region or a cross-couple region XCR. According to the embodiment, the cross-couple region XCR may be formed between the first and second active regions AR1 and AR2. FIG. 2A only shows a part of the standard cell 100 for convenience of description, and the standard cell 100 may be designed to further include other components.

The first and second active regions AR1 and AR2 extend along a first direction (e.g., X-direction), and may be arranged in parallel with each other in a second direction (e.g., Y-direction) that is substantially perpendicular to the first direction. The first active region AR1 and the second active region AR2 may be spaced apart from each other in the second direction, and may have different conductive types from each other. The first and second active regions AR1 and AR2 may be referred to as diffusion regions. In addition, a region between the first active region AR1 and the second active region AR2 may be referred to as a dummy region (e.g., DR of FIG. 8 or FIG. 18) or a middle of line (MOL) region, and the cross-couple region XCR may be formed in the dummy region.

The first to third gate lines GL1 to GL3 extend in the second direction across the first and second active regions AR1 and AR2, and may be arranged in parallel with each other in the first direction. The first to third gate lines GL1 to GL3 may correspond to gate electrodes of the semiconductor device. The first to third gate lines GL1 to GL3 may be spaced apart from one another with constant spaces. A pitch among the first to third gate lines GL1 to GL3, e.g., gate pitch, may be referred to as critical poly pitch or contacted poly pitch (CPP). According to the embodiment, in the standard cell 100, the cross-couple structure may be designed in an area corresponding to 3CPP, and the cross-couple structure included in the standard cell 100 may be referred to as a "3CPP cross-couple structure".

The first cutting layer CT1 may be disposed on the first gate line GL1 between the first and second active regions AR1 and AR2. The second cutting layer CT2 may be disposed on the third gate line GL3 between the first and second active regions AR1 and AR2. Here, the first and second cutting layers CT1 and CT2 may be marking layers for cutting some parts of the first and third gate lines GL1 and GL3, and accordingly, the first and third gate lines GL1 and GL3 may be respectively divided into two pieces. In particular, the first cutting layer CT1 is disposed crossing the first gate line GL1 so as to divide the first gate line GL1 as a first lower gate line GL1a and a first upper gate line GL1b. The second cutting layer CT2 is disposed crossing the third gate line GL3 so as to divide the third gate line GL3 as a third lower gate line GL3a and a third upper gate line GL3b.

In one embodiment, a first width W1 of the first cutting layer CT1 in the first direction may be equal to or less than 1CPP. In addition, a second width W2 of the second cutting layer CT in the first direction may be equal to or less than 1CPP. Here, the first and second widths W1 and W2 may be substantially equal to each other. In another embodiment, the first and second widths W1 and W2 may differ. The cross-couple structure included in the standard cell 100 may be referred to as a "3CPP cross-couple structure having a 1CPP cutting layer".

However, the inventive concepts are not limited thereto, and the first width W1 may be within a size range greater than a width of the first gate line GL1 and smaller than 2CPP so that the first cutting layer CT1 may completely overlap with the first gate line GL1 and may not overlap with the second gate line GL2. Likewise, the second width W2 may be within a size range greater than a width of the third gate line GL3 and smaller than 2CPP so that the second cutting layer CT2 may completely overlap with the third gate line GL3 and may not overlap with the second gate line GL2. The first width W1 and the second width W2 may be different from each other.

The first to third contacts CB1 to CB3 may be respectively disposed between the first active region AR1 and the second active region AR2. In particular, the first contact CB1 may be disposed on the first upper gate line GL1b, the second contact CB2 may be disposed on the second gate line GL2, and the third contact CB3 may be disposed on the third lower gate line GL3a. Here, the first to third contacts CB1 to CB3 may correspond to gate contacts of the semiconductor device, and may be also referred to as gate contact patterns or gate contact plugs.

In an embodiment, the first to third contacts CB1 to CB3 may be implemented as square patterns. In an embodiment, a center of the first contact CB1 may be aligned with a center of the first upper gate line GL1b, a center of the second contact CB2 may be aligned with a center of the second gate line GL2, and a center of the third contact CB3 may be aligned with a center of the third lower gate line GL3a.

The first control signal A may be applied through the first and third contacts CB1 and CB3, and the first control signal A may be transferred to the first upper gate line GL1b and the third lower gate line GL3a. In addition, the second control signal B may be applied through the second contact CB2 to be transferred to the second gate line GL2. No contact is disposed on the first lower gate line GL1a and the third upper gate line GL3b, and accordingly, the first lower gate line GL1a and the third upper gate line GL3b may correspond to dummy gate lines or dummy gate electrodes. In an embodiment, at least one of the first lower gate line GL1a and the third upper gate line GL3b may correspond to a skipped gate electrode. According to the embodiment, since the first control signal A is applied to the first upper gate line GL1b and the third lower gate line GL3a, the first upper gate line GL1b and the third lower gate line GL3a are to be electrically connected to each other. This will be described below with reference to FIGS. 4 to 14.

In the present embodiment, the first cutting layer CT1 and the second cutting layer CT2 may be arranged in a staggered form. In particular, in the cross-couple region XCR, the first cutting layer CT1 is disposed adjacent to the first active region AR1 and the second cutting layer CT2 may be disposed adjacent to the second active region AR2. Accordingly, when comparing with the standard cell including the 3CPP cutting layer crossing over the first to third gate electrodes GL1 to GL3, the standard cell 100 may have an improved degree of freedom in arranging the first to third contacts CB1 to CB3 and a size of the cross-couple region XCR in the second direction (hereinafter, referred to as 'height') may be decreased.

Figure 2B:
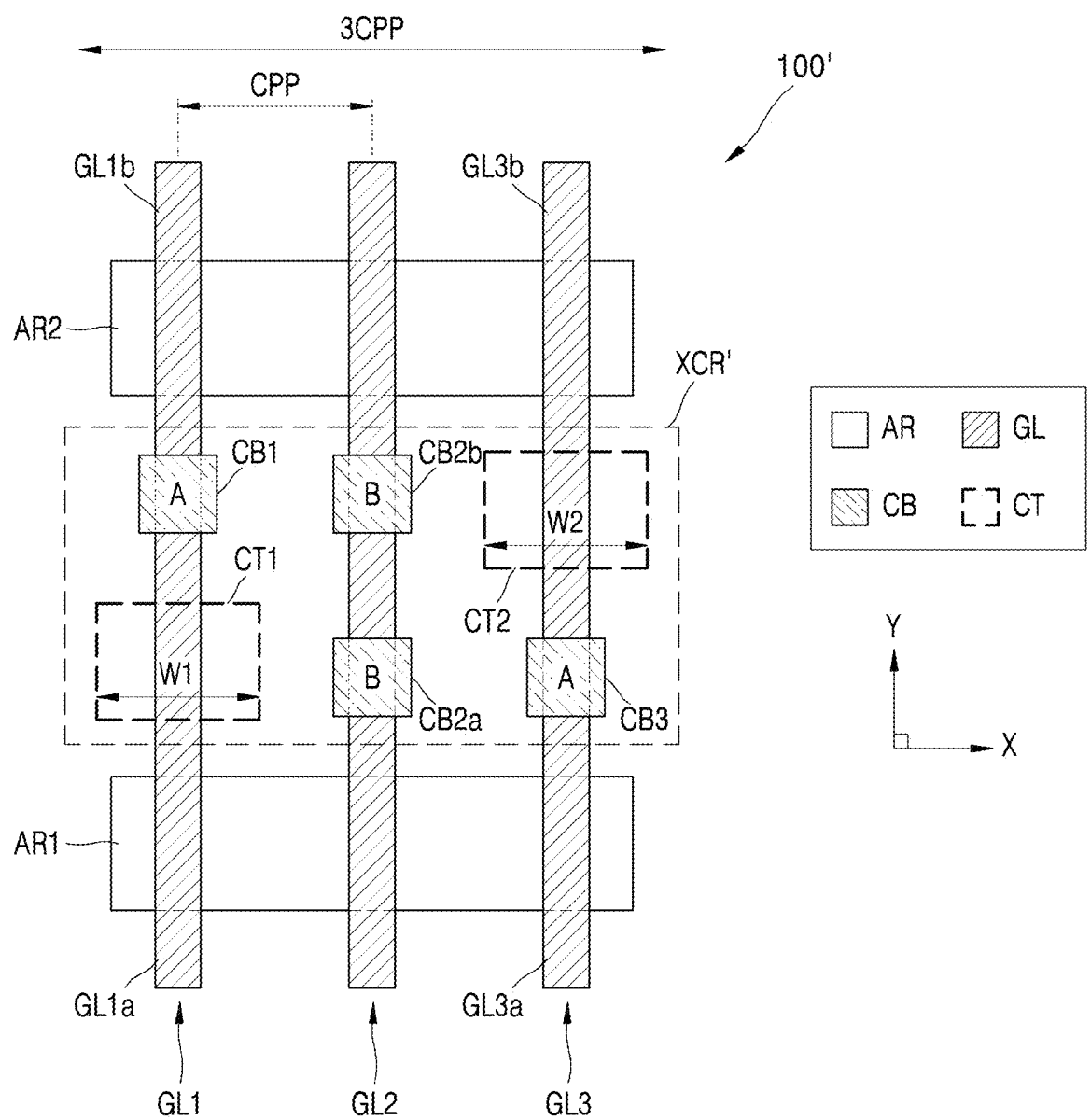

FIG. 2B is a layout of a part of a standard cell 100' corresponding to the cross-couple structure XC of FIG. 1, according to an embodiment.

Referring to FIG. 2B, the standard cell 100' may include the first and second active regions AR1 and AR2, the first to third gate lines GL1, GL2, and GL3, the first and second cutting layers CT1 and CT2, and first to third contacts CB1, CB2a, CB2b, and CB3. The standard cell 100' is a modified example of the standard cell 100 of FIG. 2A, and thus, descriptions provided with reference to FIG. 2A will be applied to the current embodiment. According to the embodiment, in a cross-couple region XCR', two second contacts CB2a and CB2b that are spaced apart from each other may be arranged on the second gate line GL2. The second control signal B may be applied through the two second contacts CB2a and CB2b, and the second control signal B may be transferred to the second gate line GL2. Hereinafter, embodiments including one second contact CB2 as illustrated with reference to FIG. 2A will be described, but the embodiments may also include two second contacts CB2a and CB2b as illustrated in FIG. 2B.

Figure 2C:
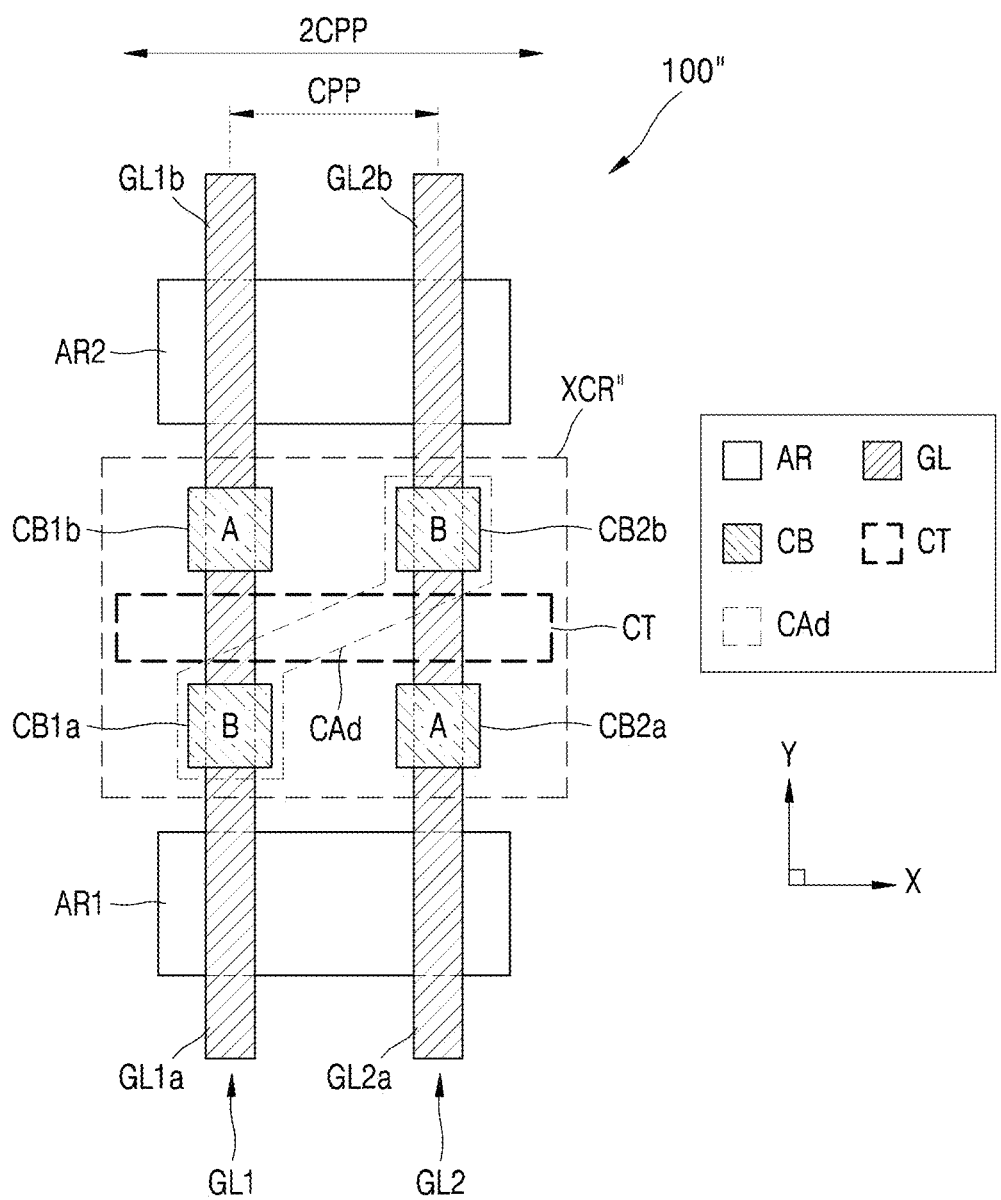
FIG. 2C is a diagram showing a layout of a part of a standard cell, which corresponds to a cross-couple structure, according to a comparative example.

FIG. 2C is a layout of a part of a standard cell 100" corresponding to a cross-couple structure according to a comparative example. Here, the standard cell 100" corresponds to a 2CPP cross-couple structure.

Referring to FIG. 2C, the standard cell 100" includes the first and second active regions AR1 and AR2, the first and second gate lines GL1 and GL2, a cutting layer CT, and a plurality of contacts CB1a to CB2b, and CAd. The cutting layer CT is disposed to extend along the first direction on the first and second gate lines GL1 and GL2 so that the first gate line GL1 is divided as the first lower gate line GL1a and the first upper gate line GL1b and the second gate line GL2 is divided as the second lower gate line GL2a and the second upper gate line GL2b.

The first control signal A is applied to the contacts CB1b and CB2a on the first upper gate line GL1b and the second lower gate line GL2a, respectively, and the second control signal B is applied to the contacts CB1a and CB2b on the first lower gate line GL1a and the second upper gate line GL2b, respectively. Here, the contacts CB1a and CB2b are electrically connected to each other via a diagonal contact CAd. If the semiconductor device is manufactured with the standard cell 100", a warning point or a weak pattern where connection between the contacts CB1a and CB2b and the diagonal contact CAd may be disconnected or the diagonal contact CAd is disconnected may occur, and accordingly, production yield of the semiconductor device may decrease.

Figure 3:
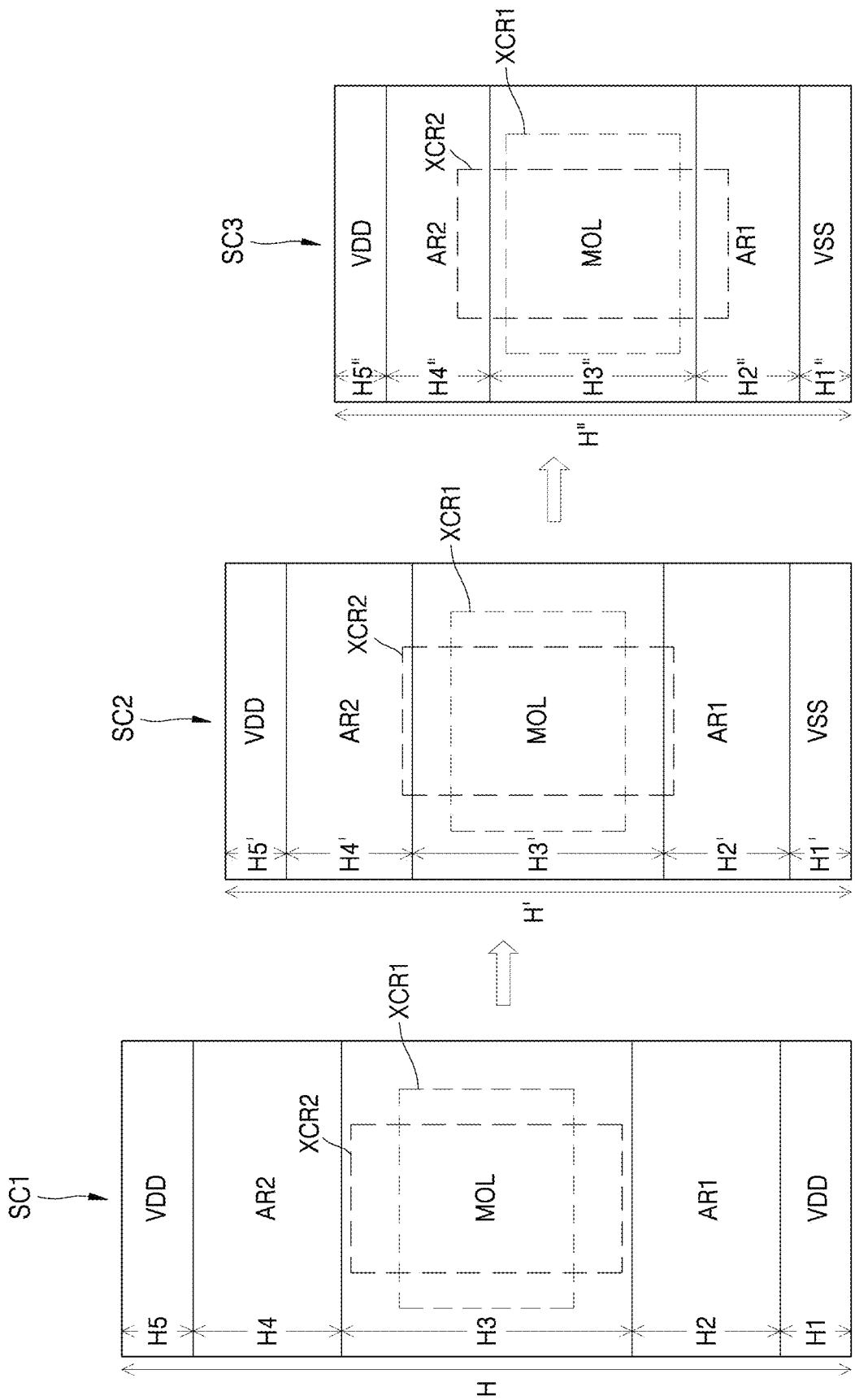
FIG. 3 is a diagram of first to third standard cells having different heights from one another, according to an embodiment.

FIG. 3 shows first to third standard cells SC1 to SC3 having different heights H, H', and H" from one another according to an embodiment.

Referring to FIG. 3, the first standard cell SC1 has a first height H, the second standard cell SC2 has a second height H' that is smaller than the first height H, and the third standard cell SC3 has a third height H" that is smaller than the second height H'. The first to third heights H, H', and H" may be respectively determined according to the number of tracks (hereinafter, referred to as 'track number') on the first to third standard cells SC1 to SC3. Here, the tracks are conductive lines that extend in the first direction (e.g., X-direction) and are arranged in parallel with one another, and may correspond to, for example, a second metal layer in the semiconductor device.

Each of the first to third standard cells SC1 to SC3 may include, for example, first and second power regions VSS and VDD to which a ground voltage and a power supply voltage are respectively applied, the first and second active regions AR1 and AR2, and a MOL region MOL. The first height H may correspond to a sum of H1 to H5 (that is, H=H1+H2+H3+H4+H5), the second height H' may correspond to a sum of H1' to H5' (that is, H'=H1'+H2"+H3"+H"+H5'), and the third height H" may correspond to a sum of H1" to H5" (that is, H"=H1"+H2"+H3"+H4"+H5"). Here, H1 is . . . .

According to the embodiment, the first to third standard cells SC1 to SC3 may respectively include a first cross-couple region XCR1. The first cross-couple region XCR1 may correspond to the 3CPP cross-couple region according to the one or more embodiments, for example, XCR of FIG. 2A or XCR' of FIG. 2B. Alternatively, a second cross-couple region XCR2 may correspond to a 2CPP cross-couple region according to the comparative example, for example, XCR" of FIG. 2C. The first cross-couple region XCR1 has a size in the first direction (hereinafter, 'width') that is greater than that of the second cross-couple region XCR2 by 1CPP, but has a smaller height than that of the second cross-couple region XCR2. Accordingly, the first cross-couple region XCR1 is suitable for the standard cell (e.g., SC2 and SC3) that is small in height.

Design rules of the semiconductor device have been narrowed according to developments in the semiconductor processing technology. In particular, as the number of tracks on each standard cell decreases, a height of the standard cell (hereinafter, referred to as 'cell height') may be reduced. The track number decreases in an order from the first standard cell SC1 to the third standard cell SC3, and accordingly, the cell height is reduced and a height of the MOL region MOL is decreased from H3 to H3". In the first standard cell SC1, the MOL region MOL has the height H3 that is sufficiently high, the cross-couple structure including the first or second cross-couple region XCR1 or XCR2 may be possibly implemented.

In the second and third standard cells SC2 and SC3, the height of the second cross-couple region XCR2 is greater than the heights H3' and H3" of the MOL regions MOL. Therefore, in the second and third standard cell SC2 and SC3, the cross-couple structure including the second cross-couple region XCR2 may not be implemented. However, since the height of the first cross-couple region XCR1 is less than the heights H3' and H3" of the MOL regions MOL, the cross-couple structure including the first cross-couple region XCR1 may be implemented in the second and third standard cells SC2 and SC3.

In addition, in the 3CPP cross-couple structure including the 3CPP cutting layer, a degree of freedom in arranging the gate contacts (for example, CB1, CB2a, CB2b, and CB3 of FIG. 2B) decreases due to the arrangement of the 3CPP cutting layer. As such, a height of the cross-couple region in the 3CPP cross-couple structure including the 3CPP cutting layer may be greater than that of the first cross-couple region XCR1, and for example, may be as high as the second cross-couple region XCR2.

As described above, the first cross-couple region XCR1 according to the embodiment includes two cutting layers having a 1CPP size (for example, CT1 and CT2 of FIG. 2A) so as to increase the degree of freedom in arranging the gate contacts and to decrease the height of the first cross-couple region XCR1. Therefore, even when the cell height is decreased according to the development in the semiconductor processing technology (e.g., sub 9T), the cross-couple structure XC as shown in FIG. 1 may be stably implemented.

Figure 4:
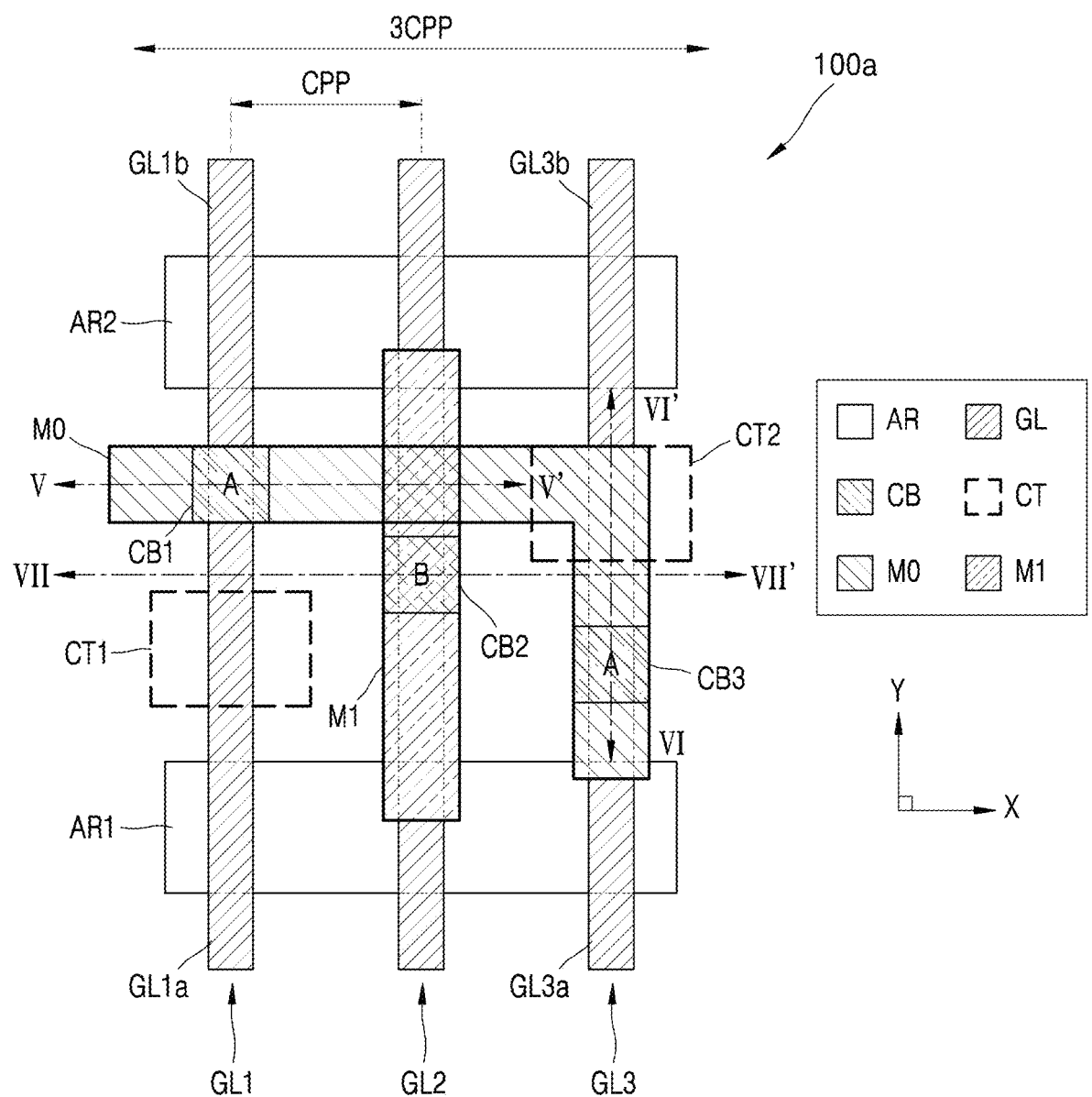
FIG. 4 is a layout of a part of a standard cell according to an embodiment.

FIG. 4 is a layout of a part of a standard cell 100a according to an embodiment of the inventive concepts.

Referring to FIG. 4, the standard cell 100a may include the first and second active regions AR1 and AR2, the first to third gate lines GL1 to GL3, the first to third contacts CB1 to CB3, the first and second cutting layers CT1 and CT2, and first and second wires M0 and M1. The standard cell 100a according to the embodiment is an implementation example of the standard cell 100 illustrated with reference to FIG. 2A, and descriptions provided above with reference to FIG. 2A may be applied to the current embodiment and the descriptions about the same elements as those of FIG. 2A are omitted. Hereinafter, differences between the standard cell 100a according to the embodiment and the standard cell 100 illustrated with reference to FIG. 2A will be described below.

The first wire M0 may be electrically connected to the first and third contacts CB1 and CB3. The first wire M0 may include a first portion electrically connected to the first contact CB1 and extending in the first direction and a second portion electrically connected to the third contact CB3 and extending in the second direction. In the semiconductor device (e.g., 200a in FIGS. 5 to 7) implemented with the standard cell 100a, an upper surface of the first wire M0 may be substantially at the same level as upper surfaces of the first and third contacts CB1 and CB3. A lower surface of the first wire M0 may be located higher than lower surfaces of the first and third contacts CB1 and CB3 and an upper surface of the second gate line GL2, and accordingly, the first wire M0 may be insulated from the second gate line GL2.

The second wire M1 is disposed over the second gate line GL2 and the second contact CB2, and may be electrically connected to the second contact CB2. The second wire M1 may correspond to an upper metal layer disposed over and insulated from the first wire M0. For example, in the semiconductor device (e.g., 200a of FIGS. 5 to 7) implemented with the standard cell 100a, the second wire M1 may correspond to a first metal layer extending in the second direction.

Figure 5:
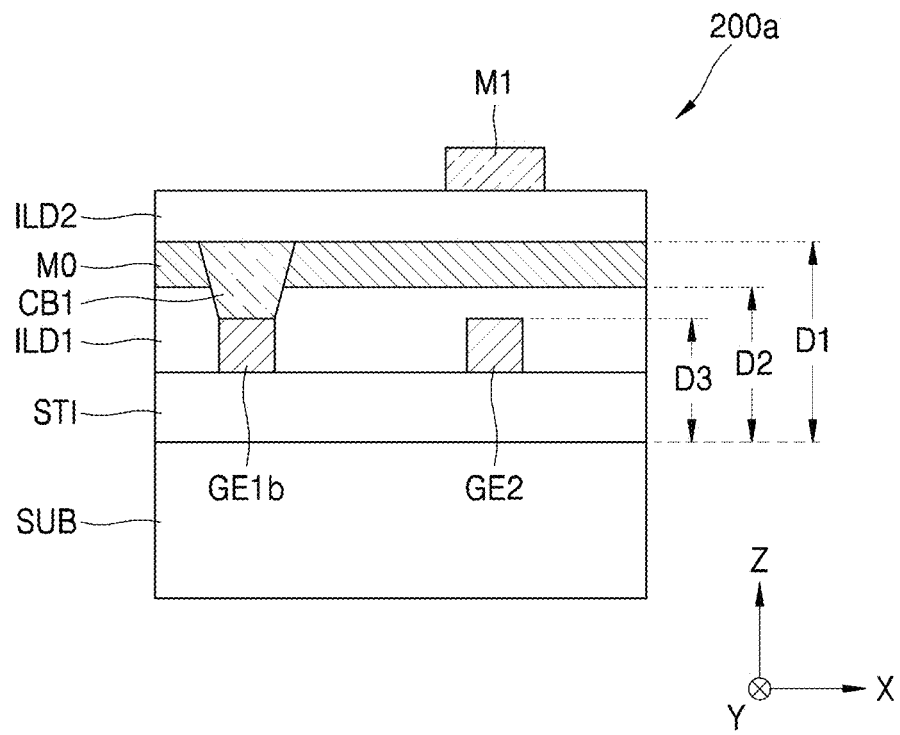
FIG. 5 is a cross-sectional view taken along a line V-V' of FIG. 4.
Figure 6:
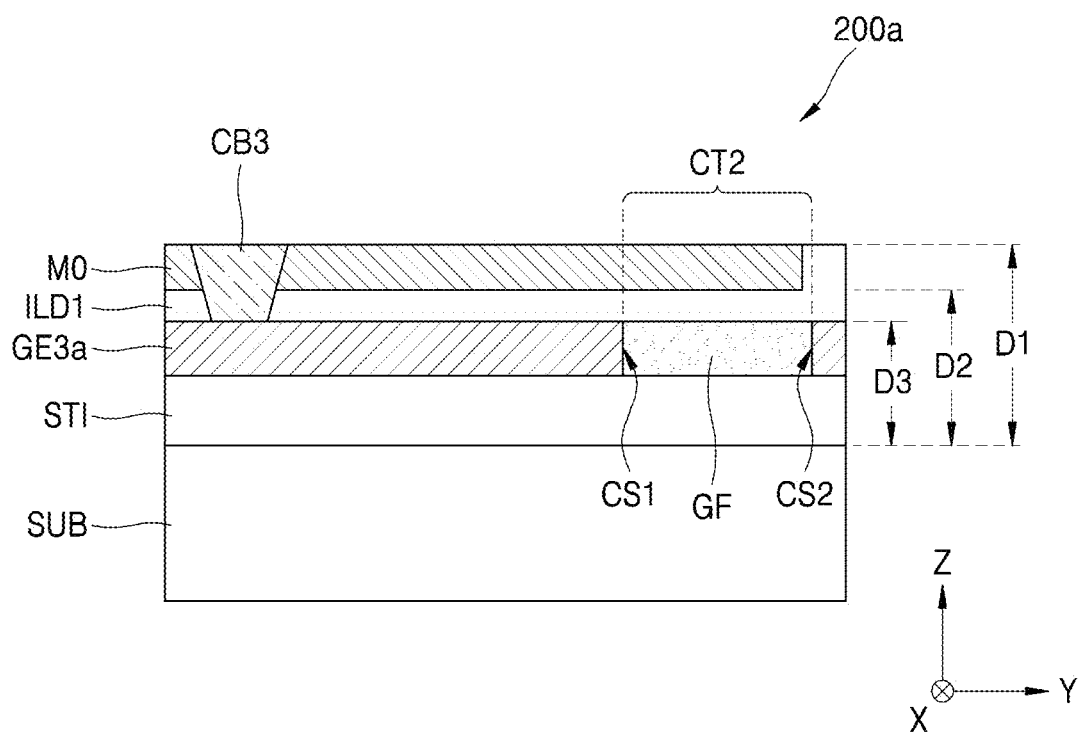
FIG. 6 is a cross-sectional view taken along a line VI-VI' of FIG. 4.
Figure 7:
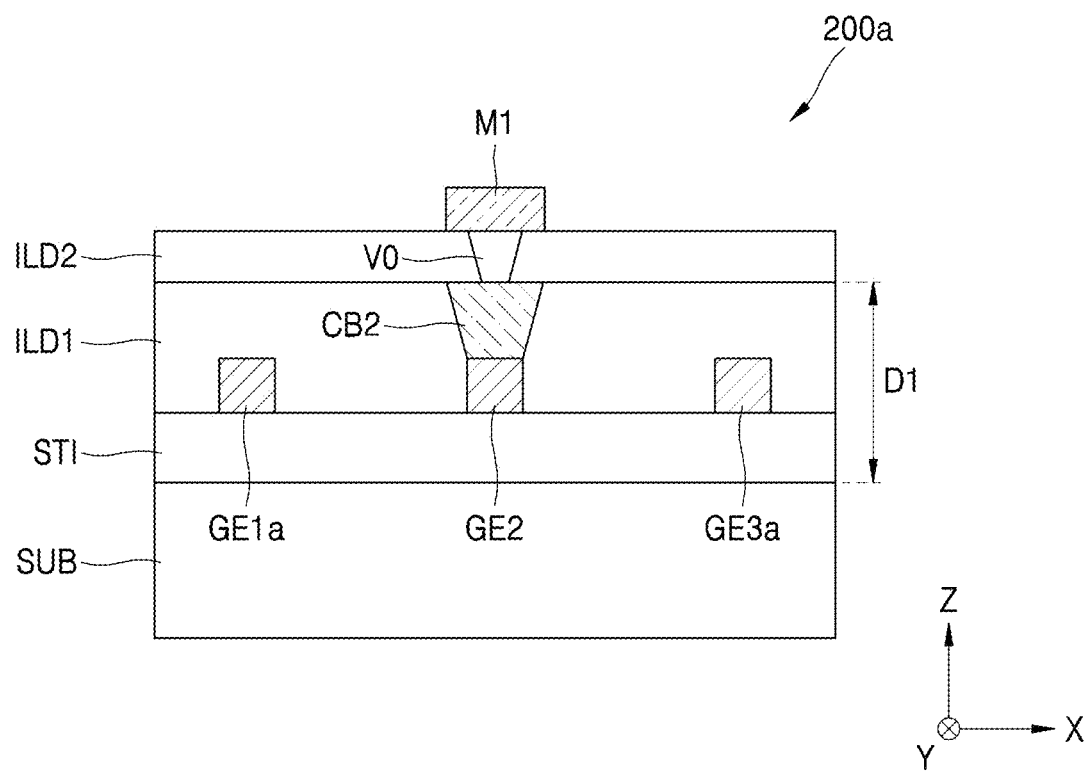
FIG. 7 is a cross-sectional view taken along a line VII-VII' of FIG. 4.

FIG. 5 is a cross-sectional view taken along a line V-V' of FIG. 4, FIG. 6 is a cross-sectional view taken along a line VI-VI' of FIG. 4, and FIG. 7 is a cross-sectional view taken along a line VII-VII' of FIG. 4. Here, the semiconductor device 200a may be an example implemented according to the layout of FIG. 4.

Referring to FIG. 5, a substrate SUB may be a semiconductor substrate, for example, the semiconductor substrate may include one of silicon, silicon-on-insulator (SOI), silicon-on-sapphire, germanium, silicon-germanium, and gallium-arsenide. An isolation layer STI may be disposed on the substrate SUB, and a first insulating layer ILD1 may be disposed on the isolation layer STI.

A first upper gate electrode GE1b and a second gate electrode GE2 may be on the isolation layer STI. The first upper gate electrode GE1b and the second gate electrode GE2 may include, for example, a metal material such as tungsten (W) and tantalum (Ta), nitrides thereof, silicides thereof, and doped polysilicon, and may be formed by, for example, a deposition process. Here, the first upper gate electrode GE1b and the second gate electrode GE2 may respectively correspond to the first upper gate line GL1b and the second gate line GL2 of FIG. 4.

The first contact CB1 is disposed on the first upper gate electrode GE1b, and the first contact CB1 may include any material having an electric conductivity, for example, tungsten. The first wire M0 is electrically connected to the first contact CB1, and may include any material having an electric conductivity, for example, copper. An upper surface of the first wire M0 may be substantially at the same level as an upper surface of the first contact CB1. In particular, a distance from the upper surface of the substrate SUB to the upper surface of the first contact CB1 may be substantially equal to a distance D1 from the upper surface of the substrate SUB to the upper surface of the first wire M0. In addition, a lower surface of the first wire M0 may be located higher than a lower surface of the first contact CB1. In particular, a distance D2 from the upper surface of the substrate SUB to the lower surface of the first wire M0 may be greater than a distance D3 from the upper surface of the substrate SUB to the lower surface of the first contact CB1. Accordingly, the first wire M0 may be electrically insulated from the second gate electrode GE2.

A second insulating layer ILD2 may be disposed on the first wire M0. The second insulating layer ILD2 may include an insulating material, for example, one of an oxide layer, a nitride layer, and an oxynitride layer. The second wire M1 may be disposed on the second insulating layer ILD2. For example, the second wire M1 may be a metal layer including W, aluminum (Al), copper (Cu), molybdenum (Mo), titanium (Ti), Ta, ruthenium (Ru), or an alloy thereof, or a polysilicon layer.

Referring to FIG. 6, a third lower gate electrode GE3a and a third upper gate electrode GE3b may be disposed on the isolation layer STI. The third lower gate electrode GE3a and the third upper gate electrode GE3b may include, for example, a metal material such as W and Ta, nitrides thereof, silicides thereof, and doped polysilicon, and may be formed by, for example, a deposition process.

The third contact CB3 is disposed on the third lower gate electrode GE3a, and the third contact CB3 may include any material having an electric conductivity, for example, W. The first wire M0 is electrically connected to the third contact CB3, and may include any material having an electric conductivity, for example, copper. The upper surface of the first wire M0 may be substantially at the same level as an upper surface of the third contact CB3. In particular, a distance from the upper surface of the substrate SUB to the upper surface of the third contact CB3 may be substantially equal to the distance D1 from the upper surface of the substrate SUB to the upper surface of the first wire M0. In addition, a lower surface of the first wire M0 may be located higher than a lower surface of the third contact CB3. In particular, the distance D2 from the upper surface of the substrate SUB to the lower surface of the first wire M0 may be greater than the distance D3 from the upper surface of the substrate SUB to the lower surface of the third contact CB3.

In one embodiment, a gap-fill layer GF may be disposed in a region between the third lower gate electrode GE3a and the third upper gate electrode GE3b (that is, a second cutting region CT2 corresponding to the second cutting layer CT2 of FIG. 4). In one embodiment, the gap-fill layer GF may be a nitride layer, and may include, for example, silicon insulating layer (SiN). In one embodiment, a cutting surface CS1 of the third lower gate electrode GE3a and a cutting surface CS2 of the third upper gate electrode GE3b may be formed as rectangles. Here, a spacer may not be disposed between the cutting surface CS1 of the third lower gate electrode GE3a and the gap-fill layer GF and between the cutting surface CS2 of the third upper gate electrode GE3b and the gap-fill layer GF. A gap-fill layer of the same material as the gap-fill layer GF may fill the first cutting region CT1.

Referring to FIG. 7, a via V0 may be disposed in the second insulating layer ILD2 and on the second contact CB2 to be electrically connected to the second contact CB2. The via V0 may include any material having an electric conductivity. The second wire M1 may be disposed on the via V0 to be electrically connected to the via V0. The second gate electrode GE2 may receive the same control signal (e.g., B of FIG. 4) via the second wire M1. For example, the second wire M1 may be a metal layer including W, aluminum (Al), copper (Cu), molybdenum (Mo), titanium (Ti), Ta, ruthenium (Ru), or an alloy thereof, or a polysilicon layer.

Figure 8:
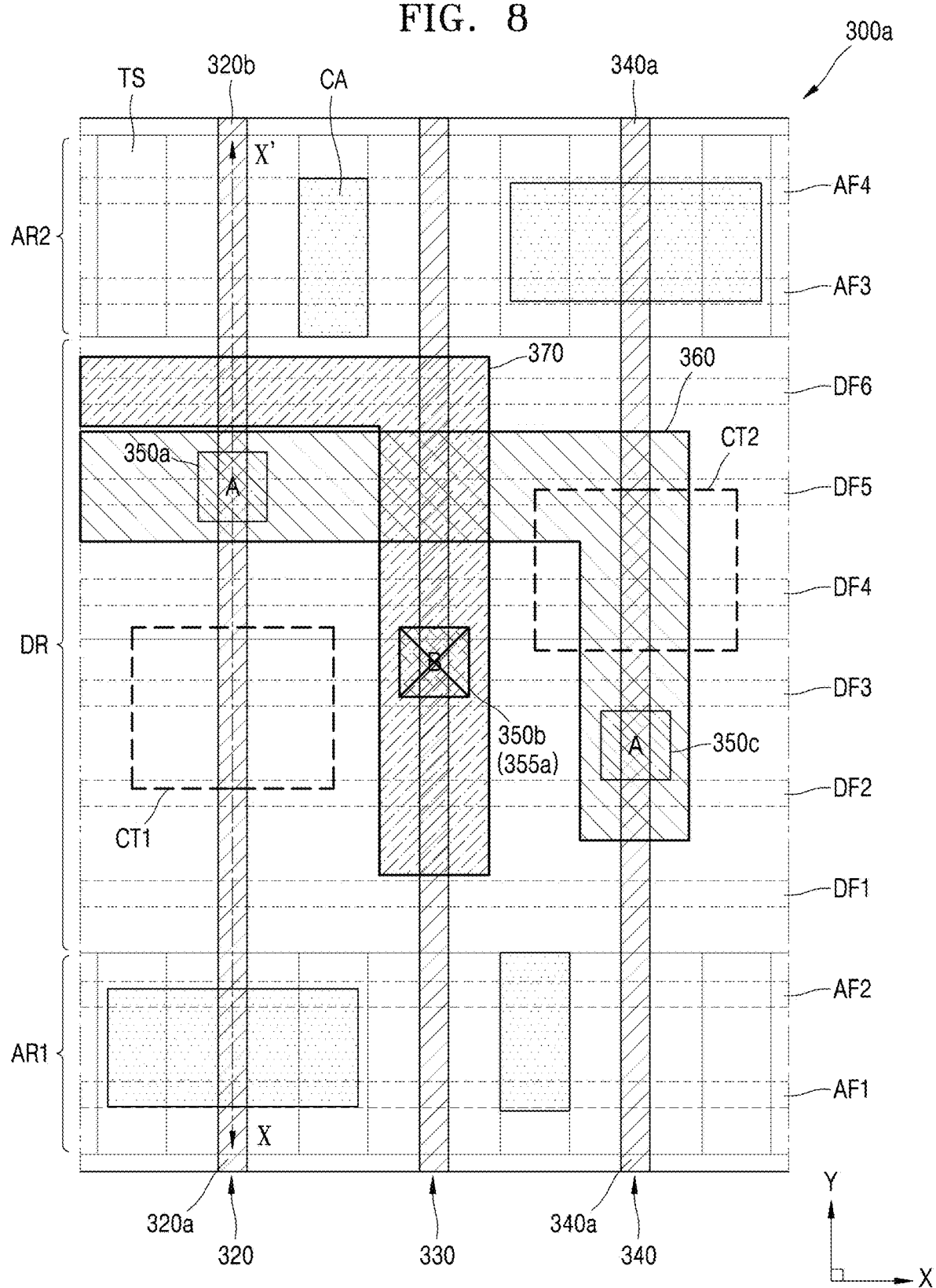
FIG. 8 is a layout of a part of a standard cell according to an embodiment.

FIG. 8 is a layout of a part of an integrated circuit 300a according to an embodiment.

Referring to FIG. 8, the integrated circuit 300a may include the first and second active regions AR1 and AR2, an intermediate region or a dummy region DR, first to fourth active fins AF1 to AF4, first to sixth dummy fins DF1 to DF6, first to third gate lines 320 to 340, the first and second cutting layers CT1 and CT2, first to third gate contacts 350a to 350c, and first and second wires 360 and 370. In addition, the integrated circuit 300a may further include trench silicides TS and source/drain contacts CA. The integrated circuit 300a according to the embodiment is an implementation example of the standard cell 100a illustrated with reference to FIG. 4, and descriptions provided above with reference to FIG. 4 may be applied to the current embodiment and overlapping descriptions are omitted.

The first to fourth active fins AF1 to AF4 and the first to sixth dummy fins DF1 to DF6 extend along the first direction, and are in parallel with one another in the second direction. In one embodiment, the first to fourth active fins AF1 to AF4 and the first to sixth dummy fins DF1 to DF6 may be spaced apart with constant spaces from one another. The first and second active fins AF1 and AF2 are disposed in the first active region AR1, and may form, for example, NMOS transistors (for example, NM1 and NM2 of FIG. 1). In addition, the third and fourth active fins AF3 and AF4 are disposed in the second active region AR2, and may form, for example, PMOS transistors (for example, PM1 and PM2 of FIG. 1). Here, the number of the active fins AF1 to AF4 and the number of dummy fins DF1 to DF6 included in the standard cell 300a may vary depending on embodiments.

The first cutting layer CT1 is disposed in the dummy region DR to be adjacent to the first active region AR1 so as to divide the first gate line 320 as a first lower gate line 320a and a first upper gate line 320b. The second cutting layer CT2 is disposed in the dummy region DR to be adjacent to the second active region AR2 so as to divide the third gate line 340 as a third lower gate line 340a and a third upper gate line 340b. In the embodiment, the first and second cutting layers CT1 and CT2 are implemented as 1CPP cutting layers. In the current embodiment, the first lower gate line 320a and the third upper gate line 340b may correspond to dummy gate lines.

The trench silicides TS may be disposed on the first and second active regions AR1 and AR2 to extend in the second direction. In particular, each of the trench silicides TS may be disposed between two adjacent gate lines GL1 to GL3. The source/drain contacts CA may be disposed on the trench silicides TS.

Figure 9:
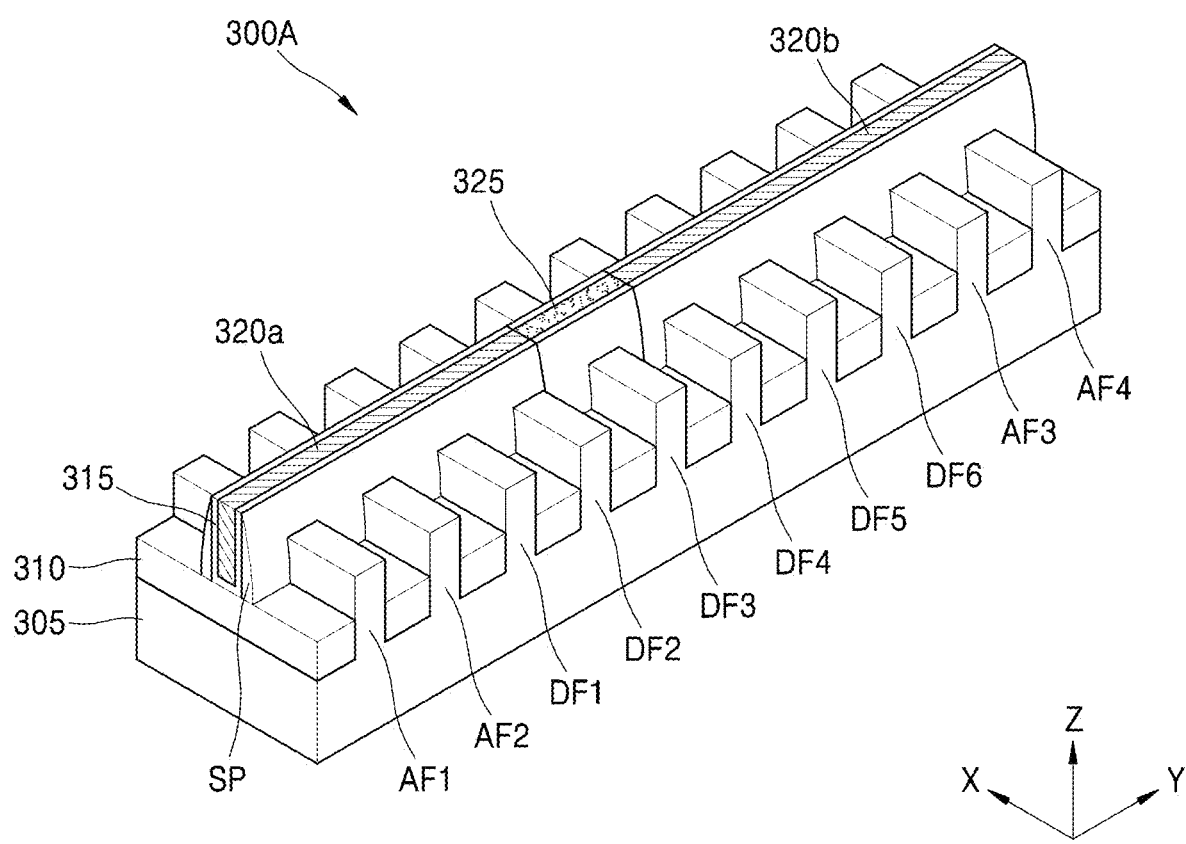
FIG. 9 is a perspective view of a semiconductor device having the layout of FIG. 8.
Figure 10:
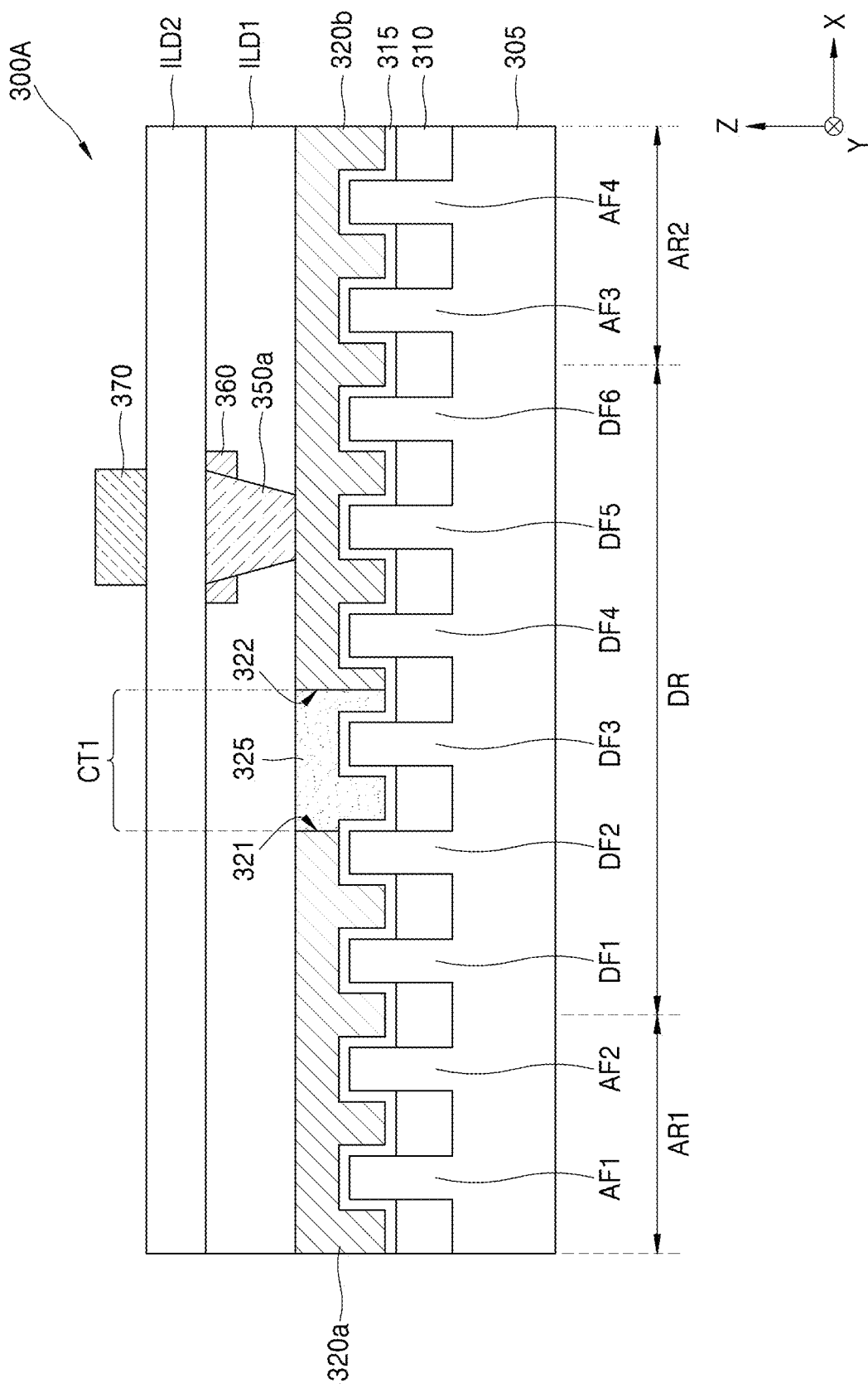
FIG. 10 is a cross-sectional view taken along a line X-X' of FIG. 8.

FIG. 9 is a perspective view showing an example of a semiconductor device 300A manufactured according to the integrated circuit 300a of FIG. 8. FIG. 10 is a cross-sectional view taken along a line X-X' of FIG. 8.

Referring to FIGS. 9 and 10, the semiconductor device 300A may include a substrate 305, the first and second insulating layers 310 and 315, the first to fourth active fins AF1 to AF4, the first to sixth dummy fins DF1 to DF6, the first lower gate electrode 320a, and the first upper gate electrode 320b. The first lower gate electrode 320a and the first upper gate electrode 320b may respectively correspond to the first lower gate line 320a and the first upper gate line 320b of FIG. 8. In addition, the first cutting region CT1 may correspond to the first cutting layer CT1 of FIG. 8. The substrate 305 may be a semiconductor substrate, and may be substantially equal to the substrate SUB of FIGS. 5 to 7.

The first to fourth active fins AF1 to AF4 and the first to sixth dummy fins DF1 to DF6 may be connected to and/or integral with the substrate 305. In one embodiment, the first and second active fins AF1 and AF2 may be active regions obtained by doping portions perpendicularly protruding from the substrate 305 with n+ impurities, the third and fourth active fins AF3 and AF4 may be active regions obtained by doping portions perpendicularly protruding from the substrate 305 with p+ impurities, and the first to sixth dummy fins DF1 to DF6 may be regions that protrude perpendicularly from the substrate 305 and are not doped.

The first insulating layer 310 may include an insulating material, for example, one of an oxide layer, a nitride layer, and an oxynitride layer. The first insulating layer 310 may be disposed to a desired (or, alternatively a predetermined) height in spaces among the first to fourth active fins AF1 to AF4 and the first to sixth dummy fins DF1 to DF6. Since the first insulating layer 310 is disposed among the first to fourth active fins AF1 to AF4 and the first to sixth dummy fins DF1 to DF6, the first insulating layer 310 may be used as an isolation layer.

The second insulating layer 315 may include an insulating material, for example, one of an oxide layer, a nitride layer, and an oxynitride layer. The second insulating layer 315 may be disposed on the first to fourth active fins AF1 to AF4, the first to sixth dummy fins DF1 to DF6, and the first insulating layer 310. The second insulating layer 315 may be used as a gate insulating layer between the first and second active fins AF1 and AF2 and the first lower gate line 320a, and between the third and fourth active fins AF3 and AF4 and the first upper gate line 320b.

The first lower gate electrode 320a may be disposed on the second insulating layer 315, the first and second active fins AF1 and AF2, and some parts of the first and second dummy fins DF1 and DF2. As such, the first lower gate electrode 320a may have a structure covering portions of the first and second active fins AF1 and AF2, the first and second dummy fins DF1 and DF2, and the second insulating layer 315. The first upper gate line 320b may be disposed on the second insulating layer 315, the fourth to sixth dummy fins DF4 to DF6, and the third and fourth active fins AF3 and AF4. As such, the first upper gate line 320b may have a structure covering portions of the fourth to sixth dummy fins DF4 to DF6 and the third and fourth active fins AF3 and AF4.

According to the embodiment, the first gate electrode 320 is formed, and then spacers SP may be formed at opposite side walls of the first gate electrode 320, and the first gate electrode 320 may be partially removed at the first cutting region CT1. Accordingly, the first gate electrode 320 may be divided into the first lower gate electrode 320a and the first upper gate electrode 320b. Here, the first cutting surface 321 of the first lower gate electrode 320a contacting the first cutting region CT1 and the second cutting surface 322 of the first upper gate electrode 320b contacting the first cutting region CT1 may be respectively implemented as rectangles. Although not shown in the drawings, a third cutting surface of the third lower gate electrode 340a contacting the second cutting region CT2 and a fourth cutting surface of the third upper gate electrode 340b contacting the second cutting region CT2 may be respectively implemented as rectangles.

According to the embodiment, the gap-fill layer 325 may be disposed on the part in the first gate electrode 320 corresponding to the first cutting region CT1. In one embodiment, the gap-fill layer 325 may include a nitride layer, e.g., SiN. In particular, after removing a part of the first gate electrode 320 by the first cutting region CT1, the gap-fill layer 325 may be formed between the first lower gate electrode 320a and the first upper gate electrode 320b to correspond to the first cutting region CT1 by an atomic layer deposition (ALD) process. Although not shown in the drawings, a gap-fill layer may be disposed at the second cutting region CT2 between the third lower gate electrode 340a and the third upper gate line 340b. This gap-fill layer for the second cutting region CT2 may be formed concurrently with the gap-fill layer 325 for the first cutting region CT1. The gap-fill layers for the first and second cutting regions CT1 and CT2 may have the same width as the respective gate lines.

Referring to FIG. 10, the first insulating layer ILD1 may be disposed on the first lower gate electrode 320a, the gap-fill layer 325, and the first upper gate electrode 320b. The first gate contact 350a may be disposed on the first upper gate electrode 320b in the dummy region DR. The first wire 360 is disposed at the same layer level as that of the first gate contact 350a to be electrically connected to the first gate contact 350a. The second insulating layer ILD2 may be disposed on the first insulating layer ILD1, the first gate contact 350a, and the first wire 360. The second wire 370 may be disposed over the first wire 360, and in particularly, on the second first insulating layer ILD2.

Figure 11:
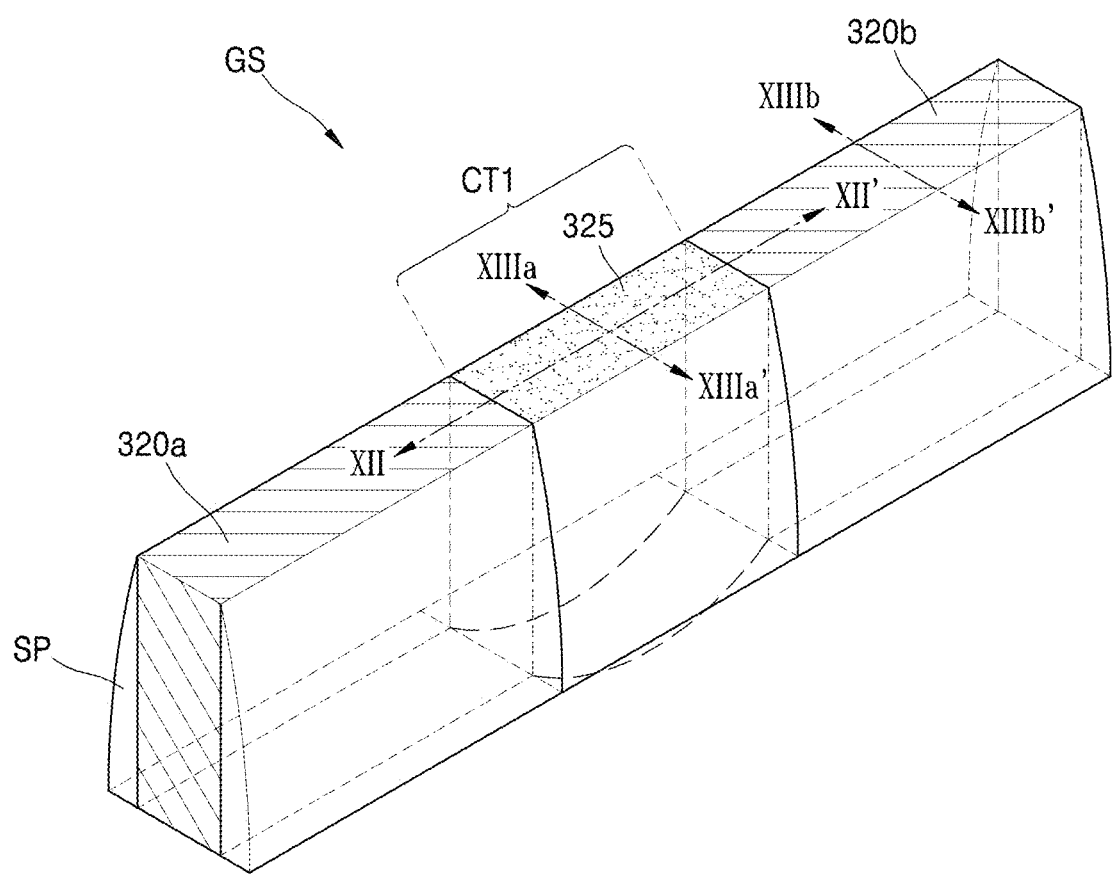
FIG. 11 is a perspective view showing a gate structure including a first lower gate electrode and a first upper gate electrode of FIG. 9 in more detail.
Figure 12:
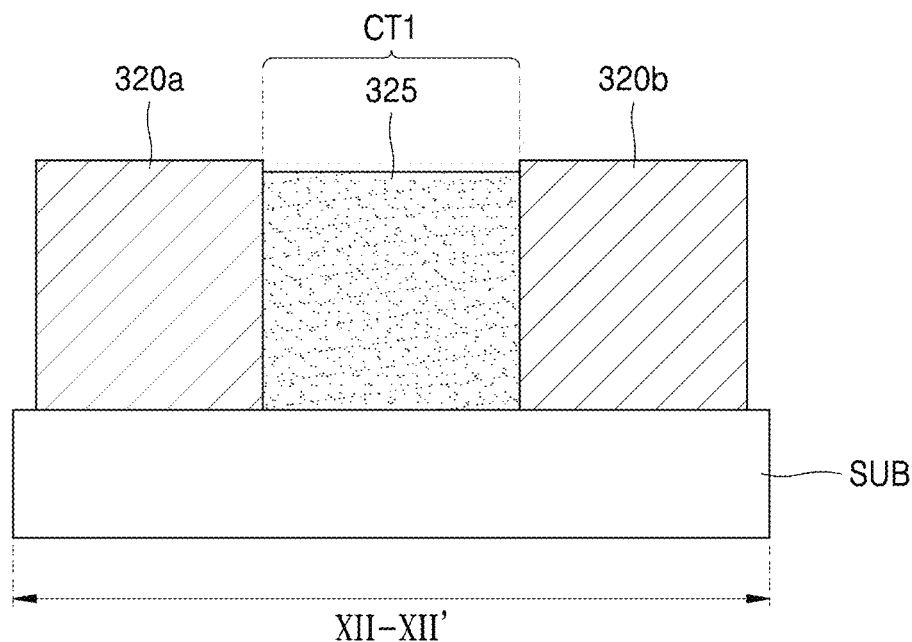
FIG. 12 is a cross-sectional view taken along a line XII-XII' of FIG. 11.
Figure 13:
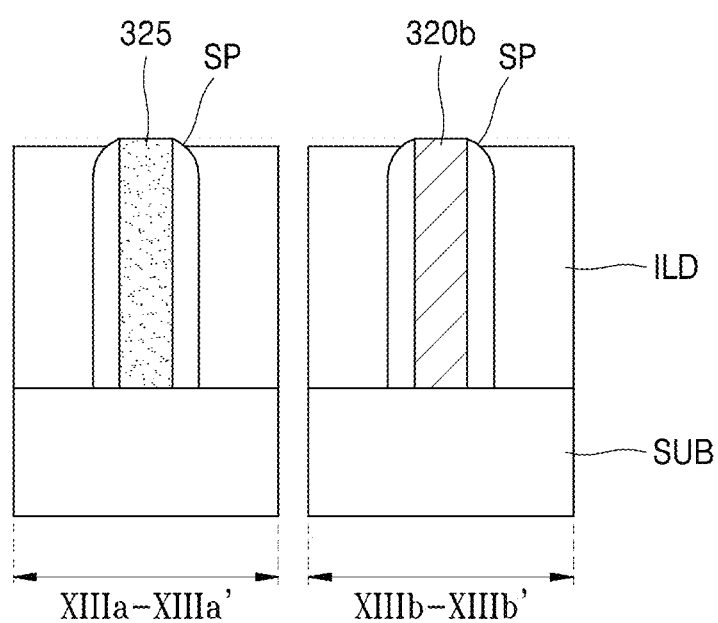
FIG. 13 is a cross-sectional view taken along a line XIIIa-XIIIa' and a line XIIIb-XIIIb' of FIG. 11.

FIG. 11 is a perspective view of a gate structure GS including the first lower gate electrode 320a and the first upper gate electrode 320b of FIG. 9 in more detail. FIG. 12 is a cross-sectional view taken along a line XII-XII' of FIG. 11, and FIG. 13 is a cross-sectional view taken along a line XIIIa-XIIIa' and a line XIIIb-XIIIb' of FIG. 11. In FIGS. 11 to 13, the gate insulating layer is omitted for convenience of description, but as shown in FIG. 9, the second insulating layer 315 (e.g., the gate insulating layer) may be further disposed.

Referring to FIG. 11, after forming the spacers SP at opposite side walls of the first gate electrode 320, a part corresponding to the first cutting region CT1 may be removed in the first gate electrode 320. Here, although the first gate electrode 320 is partially removed by the first cutting region CT1, the spacers SP are not removed. Therefore, the spacers SP may be continuously disposed throughout the first lower gate electrode 320a, the first cutting region CT1, and the first upper gate electrode 320b.

The gap-fill layer 325 may be disposed on the first cutting region CT1 between the first lower gate electrode 320a and the first upper gate line 320b. For example, the gap-fill layer 325 may include SiN. In more detail, after removing a part of the first gate electrode 320 at the first cutting region CT1, the gap-fill layer 325 may be formed between the first lower gate electrode 320a and the first upper gate electrode 320b to correspond to the first cutting region CT1 by an ALD process. Although not shown in the drawings, a gap-fill layer may be disposed at the second cutting region CT2 between the third lower gate electrode 340a and the third upper gate line 340b in the same manner.

Figure 14:
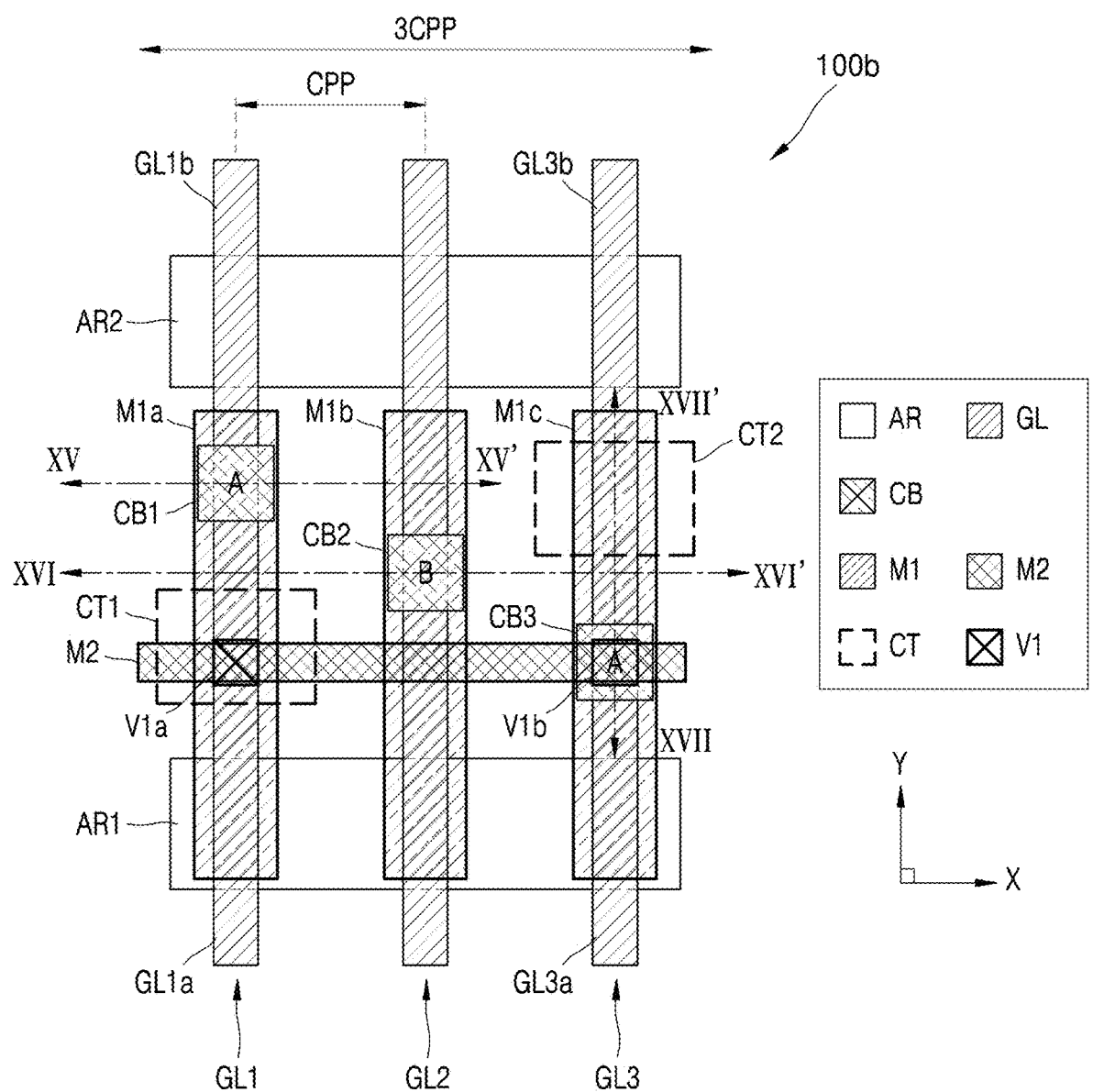
FIG. 14 is a layout of a part of a standard cell according to an embodiment.

FIG. 14 is a layout of a part of the standard cell 100b according to an embodiment of the inventive concepts.

Referring to FIG. 14, the standard cell 100b may include the first and second active regions AR1 and AR2, the first to third gate lines GL1 to GL3, the first to third contacts CB1 to CB3, the first and second cutting layers CT1 and CT2, and first to fourth wires M1a, M1b, M1c, and M2. The standard cell 100b according to the embodiment is an example of the standard cell 100 illustrated with reference to FIG. 2A, and descriptions provided above with reference to FIG. 2A may be applied to the current embodiment and the descriptions about the same elements as those of FIG. 2A are omitted. Hereinafter, differences between the standard cell 100b according to the embodiment and the standard cell 100 illustrated with reference to FIG. 2A will be described below.

The first to third wires M1a to M1c may be respectively disposed on the first to third gate lines GL1 to GL3. In detail, the first wire M1a may be disposed over the first upper gate line GL1b and the first contact CB1, and may be electrically connected to the first contact CB1. The second wire M1b is disposed over the second gate line GL2 and the second contact CB2, and may be electrically connected to the second contact CB2. The third wire M1c may be disposed over the third lower gate line GL3a and the third contact CB3, and may be electrically connected to the third contact CB3. For example, in the semiconductor device (for example, 200b of FIGS. 15 to 17) implemented according to the standard cell 100b, the first to third wires M1a and M1c may correspond to a first metal layer extending in the second direction.

The fourth wire M2 may be disposed over the first to third wires M1a to M1c, and may be electrically connected to the first to third wires M1a and M1c. In detail, the second wire M2 may be disposed on a via V1a, on the first wire M1a, and on a via V1b, on the third wire M1c, and may electrically connect the first and third wires M1a and M1c to each other. For example, in the semiconductor device (for example, 200b of FIGS. 15 to 17) implemented with the standard cell 100b, the fourth wire M2 may correspond to a second metal layer extending in the first direction.

Figure 15:
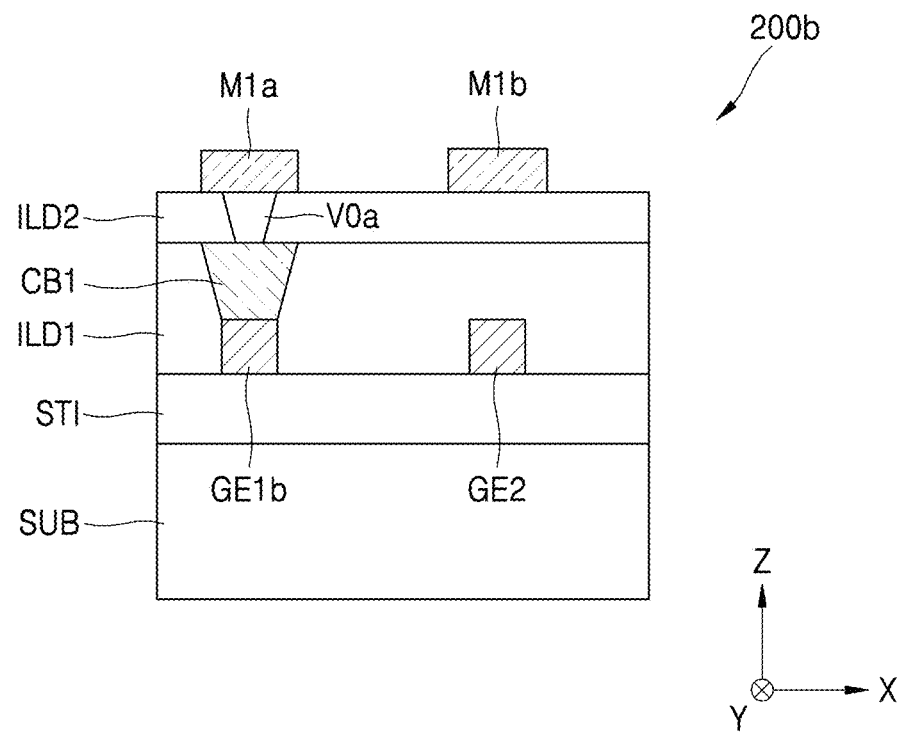
FIG. 15 is a cross-sectional view taken along a line XV-XV' of FIG. 14.
Figure 16:
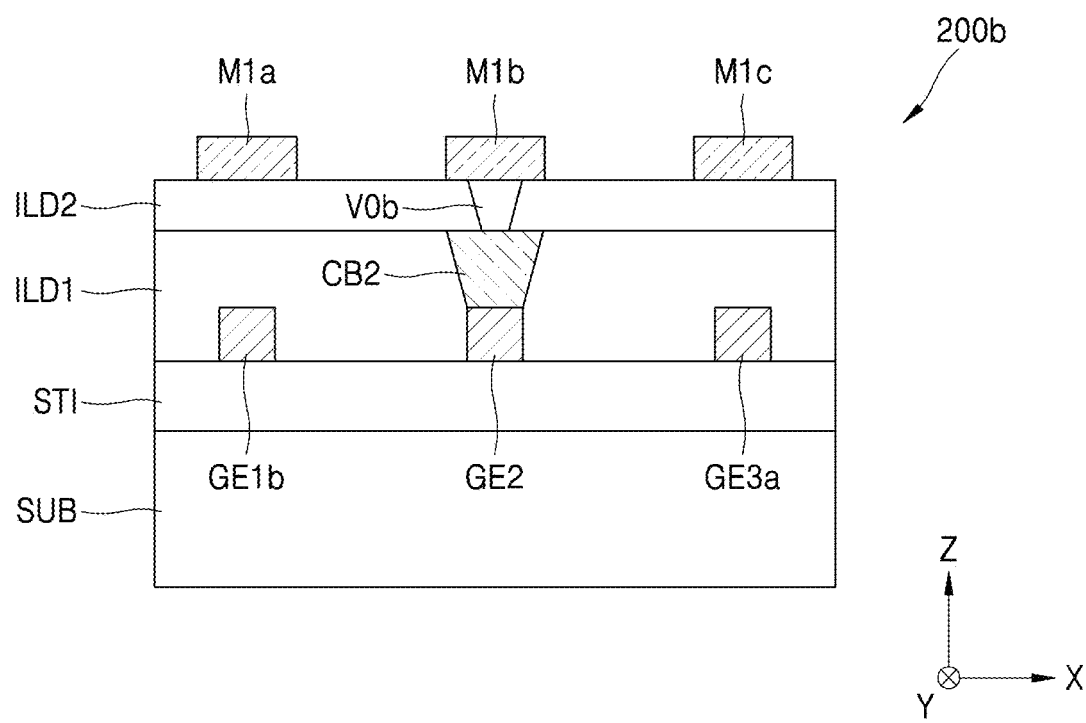
FIG. 16 is a cross-sectional view taken along a line XVI-XVI' of FIG. 14.
Figure 17:
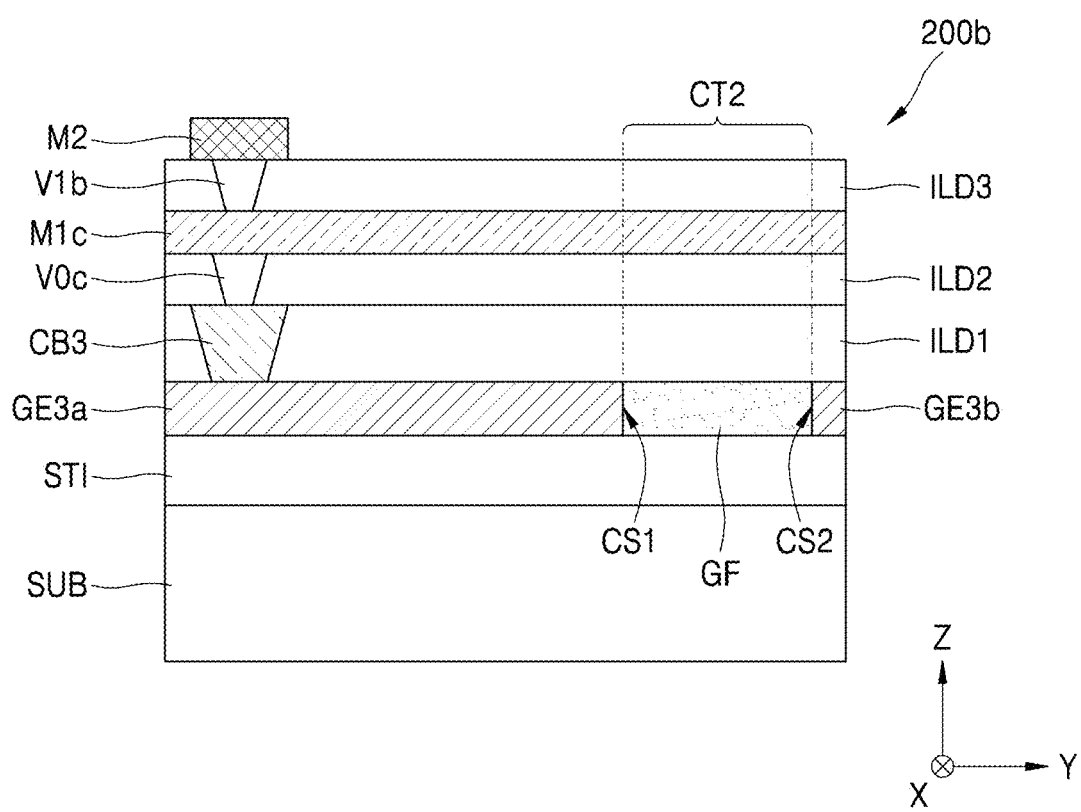
FIG. 17 is a cross-sectional view taken along a line XVII-XVII' of FIG. 14.

FIG. 15 is a cross-sectional view taken along a line XV-XV' of FIG. 14, FIG. 16 is a cross-sectional view taken along a line XVI-XVI' of FIG. 14, and FIG. 17 is a cross-sectional view taken along a line XVII-XVII' of FIG. 14. Here, the semiconductor device 200b may be an example implemented according to the layout of FIG. 14. The semiconductor device 200b correspond to a modified example of the semiconductor device 200a illustrated with reference to FIGS. 5 to 7, and descriptions about the same elements as those of FIGS. 5 to 7 will be omitted.

Referring to FIG. 15, the first contact CB1 may be disposed on the first upper gate electrode GE1b, a via V0a may be disposed on the first contact CB1, the first wire M1a may be disposed on the via V0a, and the first to third wires M1a to M1c may be disposed at the same layer level to form the first metal layer. Referring to FIG. 16, the second contact CB2 may be disposed on the second gate electrode GE2, a via V0b may be disposed on the second contact CB2, the second wire M1b may be disposed on the via V0b, and the first to third wires M1a to M1c may be disposed at the same layer level to form the first metal layer. Referring to FIG. 17, the third contact CB3 may be disposed on the third lower gate electrode GE3a, a via V0c may be disposed on the third contact CB3, and the third wire M1c may be disposed on the via V0c. A via V1b may be disposed on the third wire M1c, and the fourth wire M2 may be disposed on the via V1b to form the second metal layer.

Figure 18:
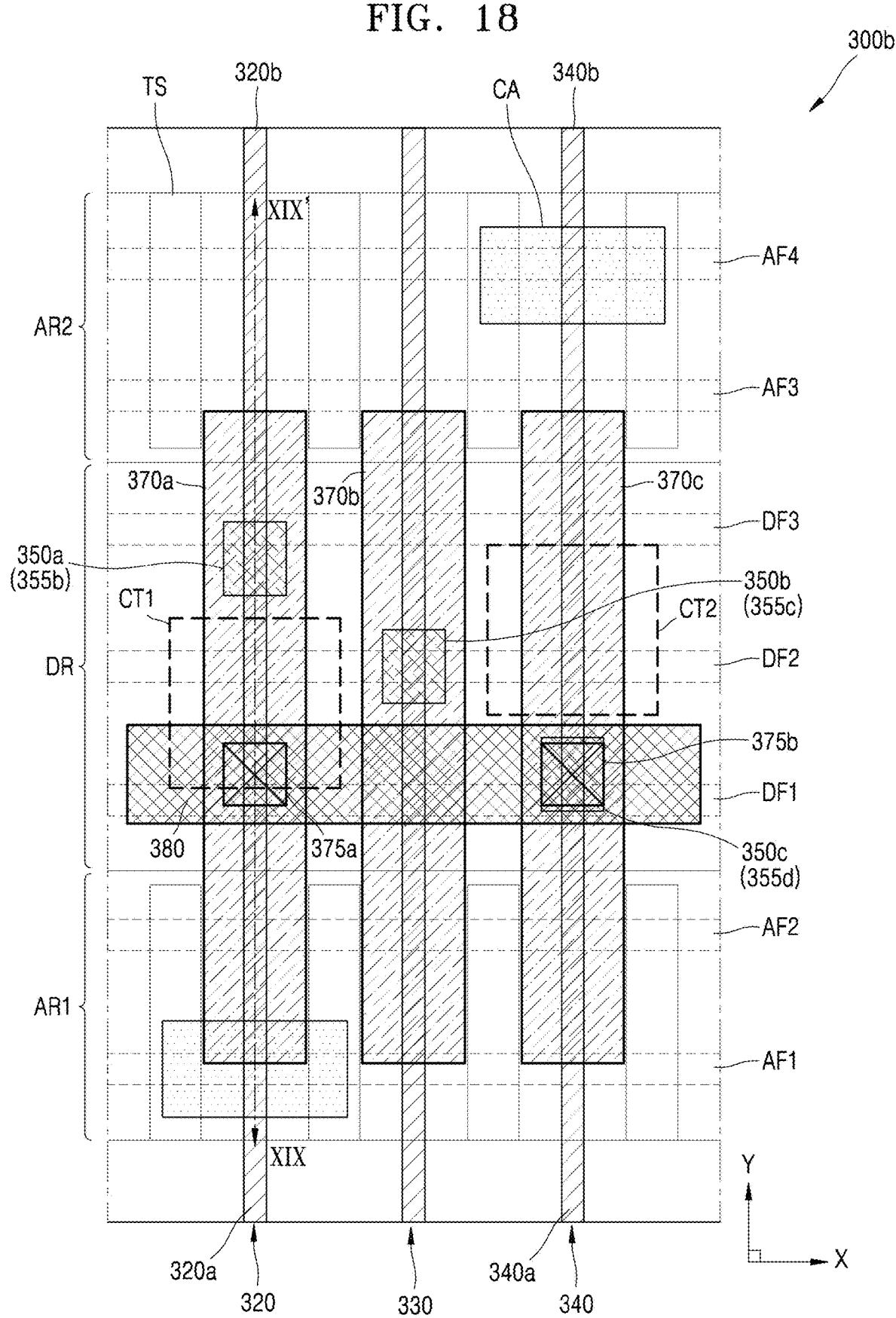
FIG. 18 is a layout of a part of a standard cell according to an embodiment.

FIG. 18 is a layout of a part of an integrated circuit 300b according to an embodiment.

Referring to FIG. 18, the integrated circuit 300b may include the first and second active regions AR1 and AR2, the first to fourth active fins AF1 to AF4, the first to third dummy fins DF1 to DF3, the first to third gate lines 320 to 340, the first and second cutting layers CT1 and CT2, the first to third gate contacts 350a to 350c, first to third wires 370a to 370c, and a fourth wire 380. In addition, the integrated circuit 300b may further include trench silicides TS and source/drain contacts CA. The integrated circuit 300b according to the embodiment is a modified example of the integrated circuit 300a of FIG. 8, and descriptions about the same elements as those of the integrated circuit 300a will be omitted.

The first to third gate contacts 350a to 350c may be respectively disposed on the first to third gate lines 320 to 340. First vias 355b to 355d may be respectively disposed on the first to third gate contacts 350a to 350c. The first to third wires 370a to 370c may be respectively disposed on the first to third gate lines 320 to 340 to extend in the second direction. In detail, the first wire 370a is disposed on a first via 355b to be electrically connected to the first via 355b. In addition, the second wire 370b is disposed on a first via 355c to be electrically connected to the first via 355c. In addition, the third wire 370c is disposed on a first via 355d to be electrically connected to the first via 355d. Second vias 375a and 375b may be respectively disposed on the first and third wires 370a and 370c. The fourth wire 380 is disposed on the second vias 375a and 375b and may extend in the first direction.

Figure 19:
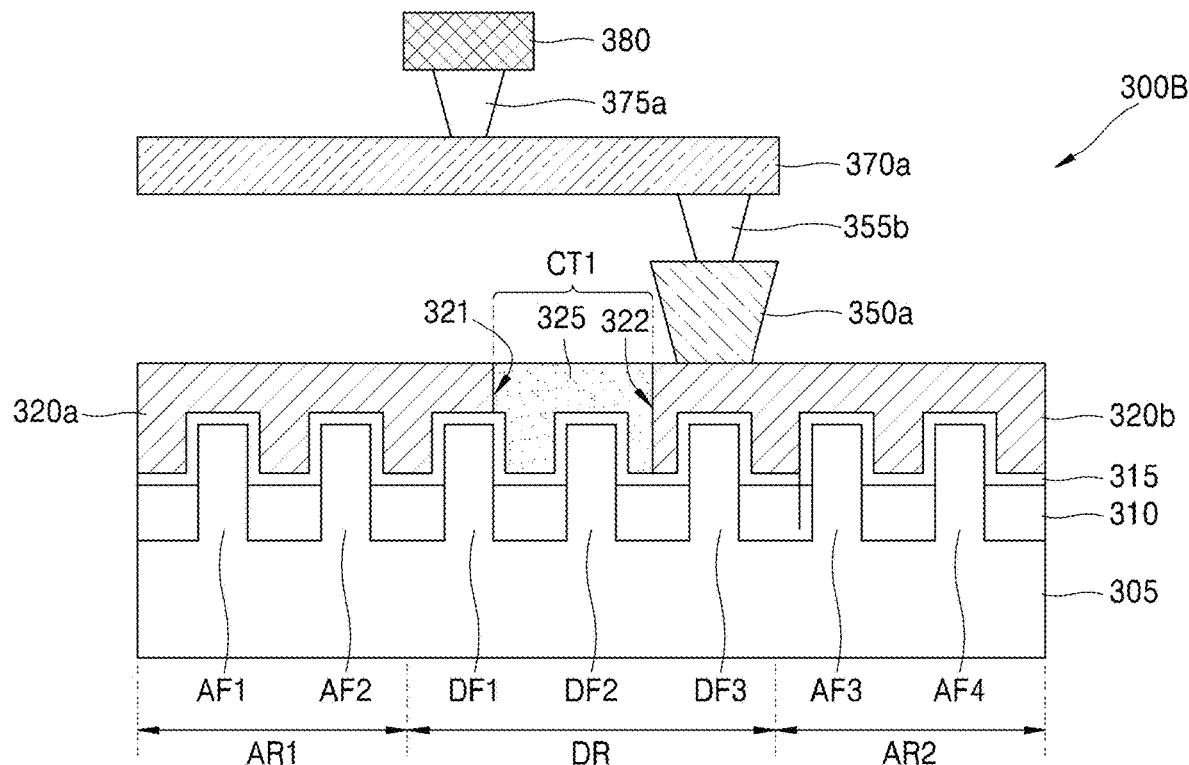
FIG. 19 is a cross-sectional view taken along a line XIX-XIX' of FIG. 18.

FIG. 19 is a cross-sectional view taken along a line XIX-XIX' of FIG. 18.

Referring to FIG. 19, the semiconductor device 300B may be an example manufactured according to the layout illustrated with reference to FIG. 18. The semiconductor device 300B according to the embodiment is a modified example of the semiconductor device 300A illustrated with reference to FIGS. 9 and 10, and descriptions about the same elements as those of the semiconductor device 300A will be omitted. The first lower gate electrode 320a may be disposed on the second insulating layer 315, the first and second active fins AF1 and AF2, and the first dummy fin DF1. The first upper gate electrode 320b may be disposed on the second insulating layer 315, the third dummy fin DF3, and the third and fourth active fins AF3 and AF4.

The first gate contact 350a may be formed on the first upper gate electrode 320b in the dummy region DR. The first via 355b may be disposed on the first gate contact 350a, and the first wire 370a may be disposed on the first via 355b to form a first metal layer. The second via 375a may be disposed on the first wire 370a, and the fourth wire 380 may be disposed on the second via 375a to form a second metal layer.

Figure 20:
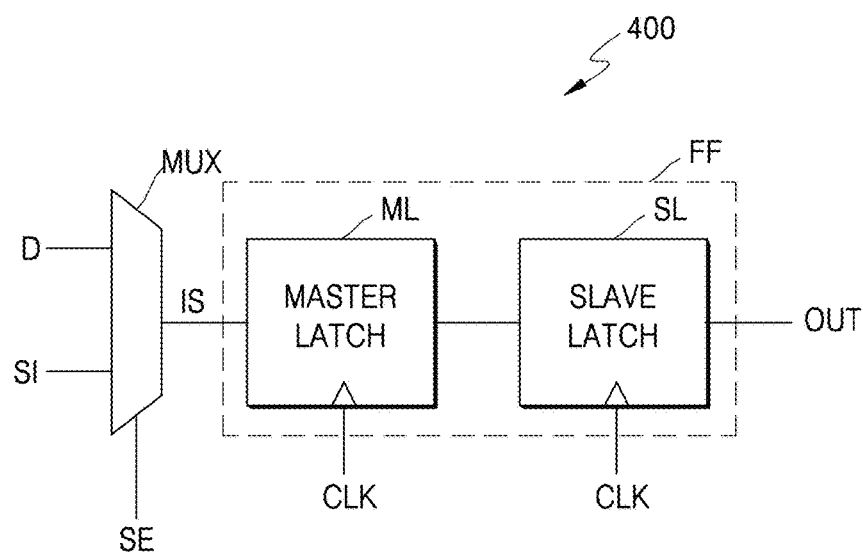
FIG. 20 is a block diagram of a scan flip-flop having a cross-couple structure according to an embodiment.

FIG. 20 is a block diagram of a scan flip-flop 400 having a cross-couple structure according to an embodiment of the inventive concepts.

Referring to FIG. 20, the scan flip-flop 400 may include a multiplexer MUX and a flip-flop FF. The scan flip-flop 400 may include the cross-couple structure described above with reference to one or more of FIGS. 1 to 19, and in particular, the multiplexer MUX and the flip-flop FF may each include the cross-couple structure (for example, XC of FIG. 1). According to the embodiment, the multiplexer MUX, a master latch ML, and/or a slave latch SL may be implemented with the standard cell 100, 100', 100a, 300a, 100b, or 300b illustrated in FIG. 2A, 2B, 4, 8, 14, or 18. The scan flip-flop 400 may be implemented with a standard cell, according to the embodiment. The integrated circuit according to one or more embodiments may include a standard cell with which the scan flip-flop 400 including the cross-couple structure is to be implemented.

The multiplexer MUX receives a data input signal D and a scan input signal SI, and may select and provide one of the data input signal D and the scan input signal SI as an internal signal IS according to an operation mode. In the present embodiment, the multiplexer MUX may include the cross-couple structure (e.g., XC of FIG. 1). The multiplexer MUX selects the data input signal D and provides the internal signal IS based on the data input signal D in a first operation mode, and selects the scan input signal SI and provides the internal signal IS based on the scan input signal SI in a second operation mode. For example, the first operation mode may be a normal mode for performing data transfer, and the second operation mode may be a scan test mode for performing a test operation.

The flip-flop FF may latch the internal signal IS based on a clock signal CLK. In the embodiment, the flip-flop FF may be a master-slave flip-flop including a master latch ML and a slave latch SL. The master latch ML latches the internal signal IS based on the clock signal CLK, and the slave latch latches an output from the master latch ML based on the clock signal CLK to provide an output signal OUT. In one embodiment, the master latch ML and/or the slave latch SL may be implemented to include the cross-couple structure.

Figure 21:
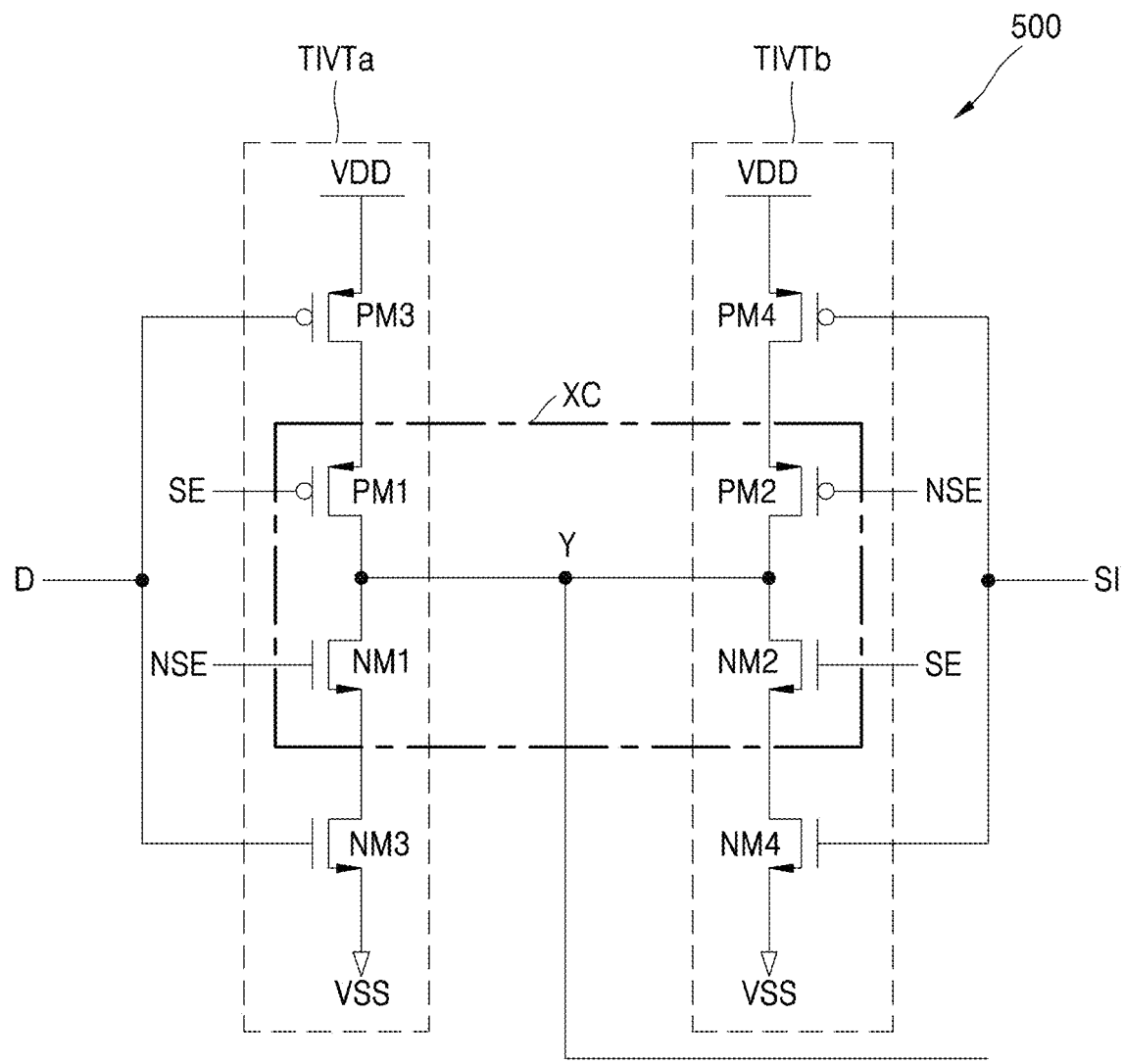
FIG. 21 is a circuit diagram of a multiplexer having a cross-couple structure according to an embodiment.

FIG. 21 is a circuit diagram of a multiplexer 500 having a cross-couple structure XC according to an embodiment of the inventive concepts.

Referring to FIG. 21, the multiplexer 500 may include a first tri-state inverter TIVTa and a second tri-state inverter TIVTb. The first and second tri-state inverters TIVTa and TIVTb share an output node Y, and may be disposed to face each other. The multiplexer 500 may be implemented with the standard cell. The cross-couple structure XC may correspond to the cross-couple structure XC of FIG. 1.

The first tri-state inverter TIVTa may include first and third PMOS transistors PM1 and PM3, and first and third NMOS transistors NM1 and NM3. In particular, the third PMOS transistor PM3 may include a source connected to a power supply terminal VDD and a gate to which the data input signal D is applied, and the third NMOS transistor NM3 may include a source connected to a ground terminal GND and a gate to which the data input signal D is applied. The first PMOS transistor PM1 may include a source connected to a drain of the third PMOS transistor PM3, a gate to which a scan enable signal SE is applied, and a drain connected to the output node Y. The first NMOS transistor NM1 may include a drain connected to the first PMOS transistor PM1 and the output node Y, a gate to which an inverted scan enable signal NSE is applied, and a source connected to the third NMOS transistor NM3.

The second tri-state inverter TIVTb may include second and fourth PMOS transistors PM2 and PM4, and second and fourth NMOS transistors NM2 and NM4. In particular, the fourth PMOS transistor PM4 may include a source connected to a power supply terminal VDD and a gate to which the scan input signal SI is applied, and the fourth NMOS transistor NM4 may include a source connected to the ground terminal GND and a gate to which the scan input signal SI is applied. The second PMOS transistor PM2 may include a source connected to a drain of the fourth PMOS transistor PM4, a gate to which the inverted scan enable signal NSE is applied, and a drain connected to the output node Y. The second NMOS transistor NM2 may include a drain connected to the second PMOS transistor PM2 and the output node Y, a gate to which the scan enable signal SE is applied, and a source connected to the fourth NMOS transistor NM4.

As described above, the scan enable signal SE may be applied to the gates of the first PMOS transistor PM1 and the second NMOS transistor NM2, and the inverted scan enable signal NSE may be applied to the gates of the first NMOS transistor NM1 and the second PMOS transistor PM2. Therefore, the first and second PMOS transistors PM1 and PM2 and the first and second NMOS transistor NM1 and NM2 may form the cross-couple structure XC. According to the embodiment, the cross couple structure XC may be implemented as the standard cell 100, 100', 100a, 300a, 100b, or 300b illustrated with reference to FIG. 2A, 2B, 4, 8, 14, or 18.

Figure 22:
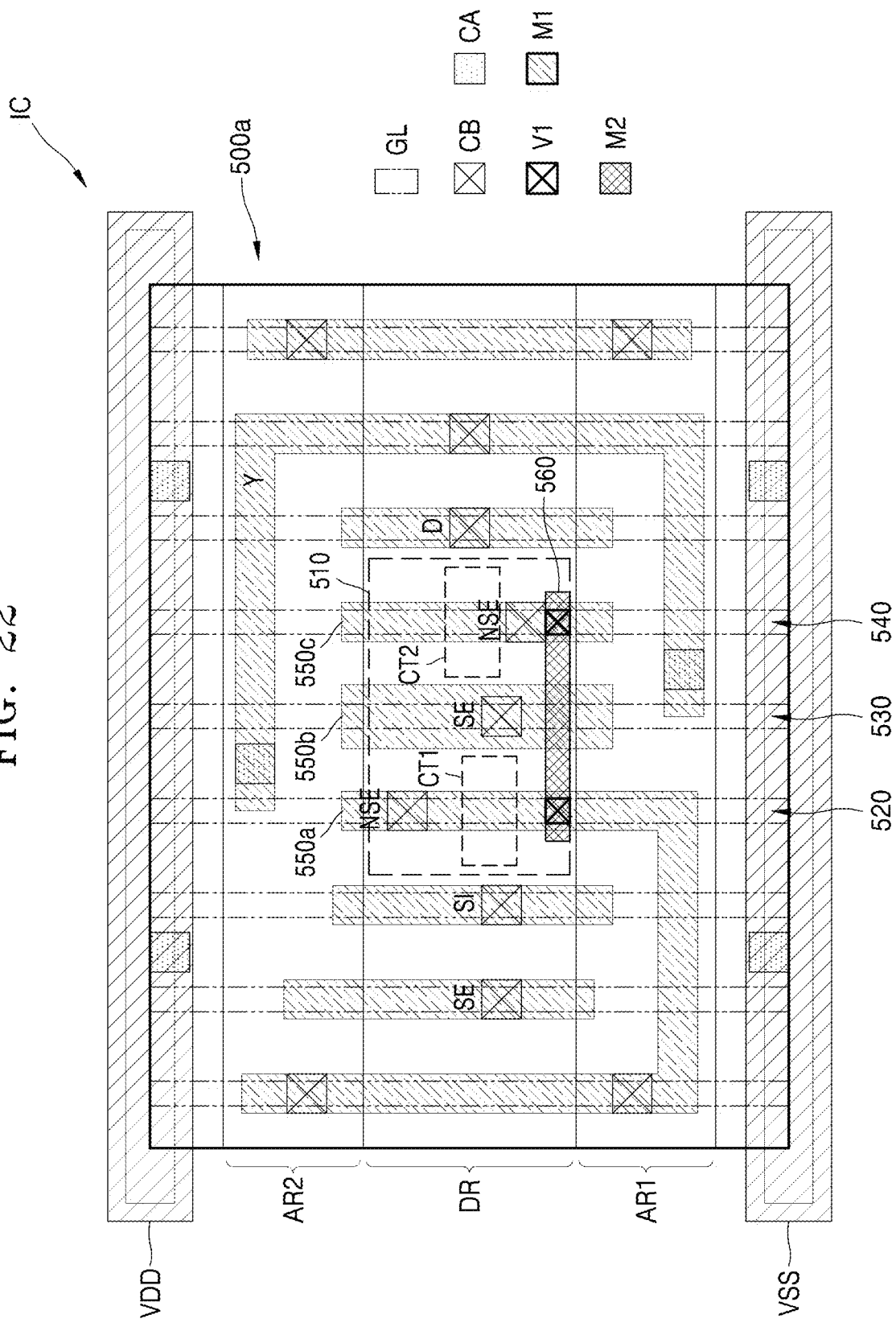
FIG. 22 is a layout of an integrated circuit including a standard cell in which the multiplexer of FIG. 21 is implemented, according to an embodiment.

FIG. 22 is a layout of an integrated circuit IC including a standard cell 500a in which the multiplexer of FIG. 21 is implemented, according to an embodiment.

Referring to FIG. 22, the integrated circuit IC may include at least one standard cell 500a defined by a cell boundary denoted as a thick solid line. The standard cell 500a may include the first and second active regions AR1 and AR2, the dummy region DR, a plurality of gate lines GL, a plurality of gate contacts CB, a plurality of source/drain contacts CA, power lines VDD and VSS, a first metal layer M1, and a second metal layer M2.

In the embodiment, the standard cell 500a may include a cross-couple region 510, and the cross-couple region 510 may correspond to the cross-couple region XCR of FIG. 2A or the cross-couple region XCR' of FIG. 2B. Here, the cross-couple region 510 may be implemented throughout a 3CPP size corresponding to the first to third gate lines 520 to 540, and may include first and second cutting layers CT1 and CT2 respectively having a 1CPP size. Therefore, the standard cell 500a may be implemented to have a 3CPP cross-couple structure having a 1CPP cutting layer.

In the embodiment, first to third wires 550a to 550c may be disposed on the first to third gate liens 520 to 540, and the first to third wires 550a to 550c may be electrically connected respectively to the first to third gate lines 520 to 540 via the gate contacts CB. In addition, a fourth wire 560 is disposed on the first and third wires 550a and 550c, and the fourth wire 560 may be electrically connected to the first and third wires 550a and 550b through vias V1. However, one or more embodiments of the inventive concepts are not limited thereto, that is, as illustrated in FIGS. 4 to 13, the standard cell 500a may include a first wire (for example, M0 of FIG. 4) electrically connected to the gate contacts CB on the first and third gate lines 520 and 540 and having an upper surface at the substantially same level as upper surfaces of the gate contacts CB, and a second wire (for example, M1 of FIG. 4) on the second gate line 530.

Figure 23:
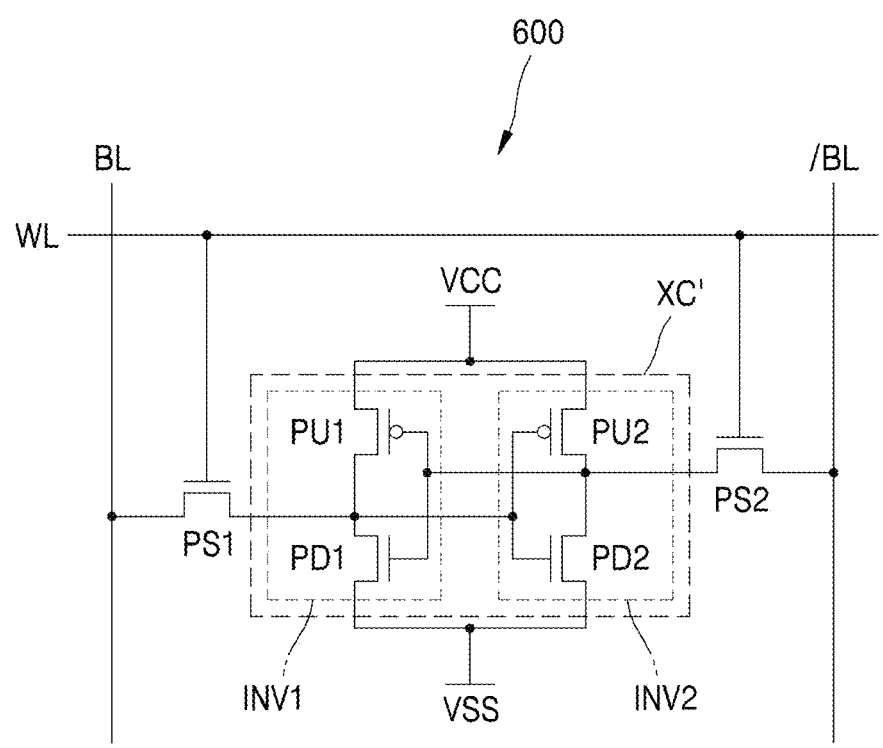
FIG. 23 is a circuit diagram of a memory cell having a cross-couple structure according to an embodiment.

FIG. 23 is a circuit diagram of a memory cell 600 having a cross-couple structure XC' according to an embodiment of the inventive concepts.

Referring to FIG. 23, the memory cell 600 may include a pair of first and second inverters INV1 and INV2 connected in parallel between a power supply terminal VCC and a ground node VSS, and first and second pass transistors PS1 and PS2 connected to output nodes of the first and second inverters INV1 and INV2. The pair of first and second inverters INV1 and INV2 form the cross-couple structure XC', and the cross-couple structure XC' may correspond to the cross-couple structure XC of FIG. 1. The first pass transistor PS1 and the second pass transistor PS2 may respectively connected to a bit line BL and a complementary bit line /BL. Gates of the first pass transistor PS1 and the second pass transistor PS2 may be connected to a word line WL.

The first inverter INV1 includes a first pull-up transistor PU1 and a first pull-down transistor PD1 connected to each other in series, and the second inverter INV2 includes a second pull-up transistor PU2 and a second pull-down transistor PD2 connected to each other in series. The first pull-up transistor PU1 and the second pull-up transistor PU2 may be PMOS transistors, and the first pull-down transistor PD1 and the second pull-down transistor PD2 may be NMOS transistors. In addition, for forming one latch circuit, an input node of the first inverter INV1 may be connected to an output node of the second inverter INV2 and an input node of the second inverter INV2 may be connected to an output node of the first inverter INV1. According to the embodiment, the cross couple structure XC' may be implemented as the standard cell 100, 100', 100a, 300a, 100b, or 300b illustrated with reference to FIG. 2A, 2B, 4, 8, 14, or 18.

Figure 24:
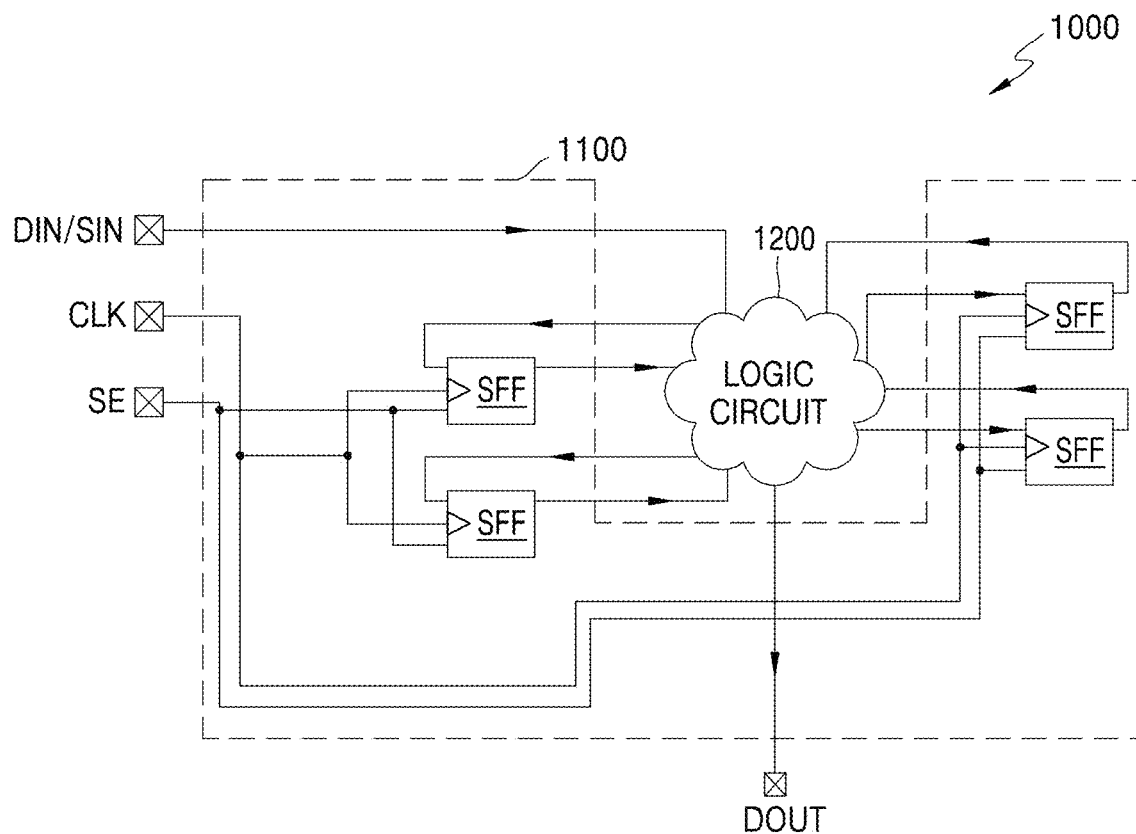
FIG. 24 is a block diagram of a data processing apparatus including a scan flip-flop having a cross-couple structure according to the embodiment.

FIG. 24 is a block diagram of a data processing apparatus 1000 including a scan flip-flop having a cross-couple structure according to the embodiment.

Referring to FIG. 24, the data processing apparatus 1000 may include a scan flip-flop group 1100 and a logic circuit 1200, and the data processing apparatus 1000 may be implemented as an integrated circuit IC, a system-on-chip SoC, a central processing unit (CPU), or a processor.

The scan flip-flop group 1100 may include a plurality of scan flip-flops SFF, each of which may be implemented as the scan flip-flop 400 illustrated with reference to FIG. 18. The scan flip-flop SFF may include a cross-couple structure according to the one or more embodiments, and in particular, may be implemented as the standard cell 100, 100', 100*a*, 300*a*, 100*b*, or 300*b* illustrated with reference to FIG. 2A, 2B, 4, 8, 14, or 18. The scan flip-flop SFF may perform data communication with the logic circuit 1200 according to the clock signal CLK. The logic circuit 1200 may be a synchronous circuit or asynchronous circuit. The logic circuit 1200 may process input data DIN or scan data SIN, and may provide output data DOUT corresponding to processing result.

Figure 25:
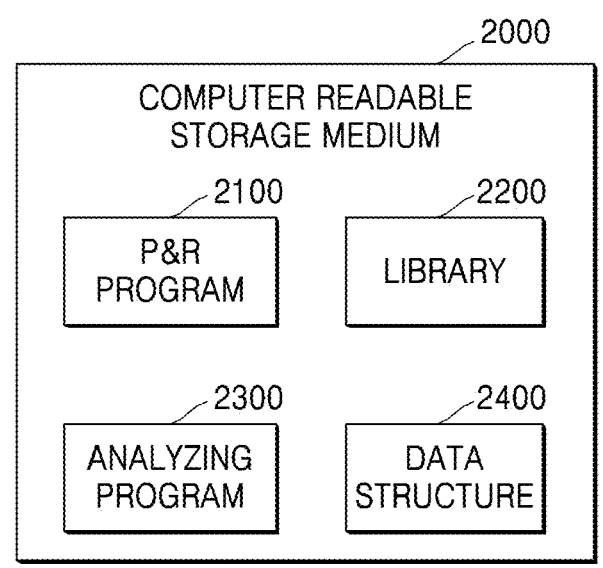
FIG. 25 is a block diagram of a storage medium according to an embodiment.

FIG. 25 is a block diagram of a storage medium 2000 according to an embodiment of the inventive concepts.

Referring to FIG. 25, the storage medium 2000 may be a computer-readable storage medium, and may include an arbitrary storage medium that may be readable by a computer while being used to provide the computer with commands and/or data. For example, the computer-readable storage medium 2000 may include magnetic or optical media, such as disks, tapes, CD-ROM, digital versatile disk-ROM (DVD-ROM), compact disk-recordable (CD-R), compact disk-rewritable (CD-RW), digital versatile disk-recordable (DVD-R), or digital versatile disk-rewritable (DVD-RW), volatile or non-volatile memory such as RAM, ROM, or flash memory, non-volatile memory accessible via a USB interface, microelectromechanical systems (MEMS), or the like. The computer readable storage medium 2000 may be inserted into the computer, may be integrated into the computer, or may be connected to the computer via a communication medium, such as a network and/or a radio link.

As illustrated in FIG. 25, the computer readable storage medium 2000 may include a place and route (P&R) program 2100, a library 2200, an analyzing program 2300, and a data structure 2400. The P&R program 2100 may include a plurality of instructions for performing the method of designing the integrated circuit by using a standard cell library including information about standard cells having the cross-couple structure according to the embodiments of the inventive concepts. For example, the computer readable storage medium 2000 may store the P&R program 2100 including certain instructions for designing the integrated circuit using the standard cell library including the standard cell illustrated in one or more of the drawings. The library 2200 may include information about the standard cell, that is, unit that constitutes the integrated circuit.

The analyzing program 2300 may include a plurality of instructions that perform a method of analyzing an integrated circuit based on data defining the integrated circuit. The data structure 2400 may include a storage space for management of data generated in the process of utilizing a standard cell library included in the library 2200, extracting specific information from a general standard cell library included in the library 2200, or analyzing characteristics of the integrated circuit by the analyzing program 2300.

While the inventive concepts has been particularly shown and described with reference to embodiments thereof, it will be understood that various changes in form and details may be made therein without departing from the spirit and scope of the following claims.

We claim:

1. An integrated circuit, comprising:
   a first active region and a second active region;
   a plurality of fin patterns formed in the first active region and the second active region;
   a plurality of gate electrodes including:
      a first gate electrode crossing the first active region,
      a second gate electrode crossing the second active region and being aligned with the first gate electrode,
      a third gate electrode crossing the first active region, and
      a fourth gate electrode crossing the second active region and being aligned with the third gate electrode;
   a gap-fill layer on a first cutting region, between the first gate electrode and the second gate electrode, and a second cutting region, between the third gate electrode and the fourth gate electrode; and
   an insulating layer on the first active region and the second active region,
   wherein the gap-fill layer and the insulating layer include different materials.

2. The integrated circuit of claim 1, wherein the plurality of gate electrode further includes:
   a fifth gate electrode between the first and second gate electrodes and the third and fourth gate electrodes, the fifth gate electrode crossing the first and second active regions.

3. The integrated circuit of claim 2, wherein the first and second active regions extend along a first direction, and
   wherein the first, fifth, and third gate electrodes are arranged along the first direction according to a pitch which is a center-to-center distance between the first gate electrode and the fifth gate electrode.

4. The integrated circuit of claim 3, wherein each of the first and second cutting region has a width equal to or less than the pitch.

5. The integrated circuit of claim 1, wherein the gap-fill layer includes a nitride layer.

6. The integrated circuit of claim 5, wherein the nitride layer includes silicon nitride.

7. The integrated circuit of claim 1, wherein the gap-fill layer has a rounded lower surface.

8. The integrated circuit of claim 1, wherein an upper surface of the gap-fill layer is substantially at the same level as upper surfaces of the first to fourth gate electrodes.

9. The integrated circuit of claim 1, wherein a distance from an upper surface of a substrate to a lower surface of the gap-fill layer is different from a distance from the upper surface of the substrate to lower surfaces of the first to fourth gate electrodes.

10. The integrated circuit of claim 1, wherein the plurality of gate electrode extend along a second direction, and
    wherein the first and second cutting regions are not overlapped in the second direction.

11. The integrated circuit of claim 1, wherein the plurality of gate electrode extend along a second direction, and
    wherein the first and second cutting regions are partially overlapped in the second direction.

12. The integrated circuit of claim 1, wherein a spacer is not disposed between a cutting surface of the first gate electrode and the gap-fill layer, and between a cutting surface of the second gate electrode and the gap-fill layer.

13. The integrated circuit of claim 1, wherein spacers are formed along sides of the first gate electrode, and along sides of the first gap-fill layer, and the spacers is continuously disposed throughout the first gate electrode and the gap-fill layer.

14. The integrated circuit of claim 1, further comprising:
a dummy region between the first active region and the second active region; and
at least one dummy fin pattern formed in the dummy region.

15. The integrated circuit of claim 1, further comprising:
a first gate contact on the first gate electrode; and
a first wire disposed at substantially the same layer level as that of the first gate contact.

16. An integrated circuit comprising a first standard cell, the first standard cell comprising:
a first active region and a second active region;
a plurality of gate electrodes including:
a first gate electrode crossing the first active region,
a second gate electrode crossing the second active region and being aligned with the first gate electrode,
a third gate electrode crossing the first active region, and
a fourth gate electrode crossing the second active region and being aligned with the third gate electrode;
a gap-fill layer on a first cutting region between the first gate electrode and the second gate electrode and a second cutting region between the third gate electrode and the fourth gate electrode, the gap-fill layer including silicon nitride; and
an insulating layer on the first active region and the second active region.

17. The integrated circuit of claim 16, wherein the plurality of gate electrode further includes:
a fifth gate electrode between the first and second gate electrodes and the third and fourth gate electrodes, the fifth gate electrode crossing the first and second active regions.

18. The integrated circuit of claim 16, further comprising a second standard cell,
wherein a first cell height of the first standard cell is different from a second cell height of the second standard cell.

19. The integrated circuit of claim 18, wherein the first cell height is greater than the second cell height.

20. The integrated circuit of claim 18, wherein the first and second cell heights are respectively determined according to a number of tracks.

21. The integrated circuit of claim 18, wherein the first standard cell further comprises a first cross-couple region, and
wherein the second standard cell comprises a second cross-couple region.

22. The integrated circuit of claim 21, wherein the first cross-couple region has an M-CPP (contacted poly pitch) size,
wherein the second cross-couple region has an N-CPP size, and
wherein N and M are different positive numbers.

23. The integrated circuit of claim 21, wherein the first cross-couple region has a 3CPP size, and
wherein the second cross-couple region has a 2CPP size.

24. The integrated circuit of claim 18, wherein a first cell width of the first standard cell is different from a second cell width of the second standard cell.

25. An integrated circuit, comprising:
a first active region and a second active region;
a plurality of fin patterns formed in the first active region and the second active region;
a plurality of gate electrodes including:
a first gate electrode crossing the first active region,
a second gate electrode crossing the second active region and being aligned with the first gate electrode,
a third gate electrode crossing the first active region,
a fourth gate electrode crossing the second active region and being aligned with the third gate electrode, and
a fifth gate electrode between the first and second gate electrodes and the third and fourth gate electrodes, the fifth gate electrode crossing the first and second active regions;
a gap-fill layer on a first cutting region between the first gate electrode and the second gate electrode and a second cutting region between the third gate electrode and the fourth gate electrode, the first and second cutting regions being arranged in a staggered form;
an insulating layer on the first active region and the second active region;
a first source/drain contact on the first gate electrode and beside the fifth gate electrode; and
a second source/drain contact on the fourth gate electrode and beside the fifth gate electrode,
wherein the gap-fill layer and the insulating layer include different materials.

26. The integrated circuit of claim 25, wherein the plurality of gate electrode extend along a second direction, and
wherein the first and second cutting regions are not overlapped in the second direction.

27. The integrated circuit of claim 25, wherein the fourth gate electrode corresponds to a dummy gate electrode.

28. The integrated circuit of claim 25, further comprising:
a plurality of trench silicides including:
a first trench silicide between the first gate electrode and the fifth gate electrode, the first trench silicide being connected to the first source/drain contact; and
a second trench silicide between the fifth gate electrode and the fourth gate electrode, the second trench silicide being connected to the second source/drain contact.

* * * * *